United States Patent
Gimelshein et al.

(10) Patent No.: US 12,146,479 B1
(45) Date of Patent: *Nov. 19, 2024

(54) APPARATUS AND METHOD OF OPERATING A GAS PUMP

(71) Applicant: TORRAMICS INC., Walnut, CA (US)

(72) Inventors: Sergey F. Gimelshein, San Jose, CA (US); Eugene Moskovets, Boxboro, MA (US); Piotr A. Garbuz, Hutto, TX (US)

(73) Assignee: TORRAMICS, INC., Walnut, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/539,436

(22) Filed: Dec. 14, 2023

Related U.S. Application Data

(63) Continuation of application No. 18/218,881, filed on Jul. 6, 2023, now Pat. No. 11,885,320.

(51) Int. Cl.
| | | |
|---|---|---|
| *F04B 35/04* | (2006.01) | |
| *F04B 37/00* | (2006.01) | |
| *H10N 10/10* | (2023.01) | |
| *H10N 19/00* | (2023.01) | |

(52) U.S. Cl.
CPC .............. *F04B 35/04* (2013.01); *F04B 37/00* (2013.01); *H10N 10/10* (2023.02); *H10N 19/00* (2023.02)

(58) Field of Classification Search
CPC .......... F04B 37/00; F04B 35/04; F04B 19/24; H10N 10/10; H10N 19/00
USPC ....................................................... 417/207
See application file for complete search history.

(56) References Cited

U.S. PATENT DOCUMENTS

| | | | |
|---|---|---|---|
| 5,529,465 A | 6/1996 | Zengerle et al. | |
| 6,533,554 B1 | 3/2003 | Vargo et al. | |
| 6,634,864 B1 * | 10/2003 | Young | F04B 17/00 |
| | | | 417/208 |
| 7,367,781 B2 | 5/2008 | Gianchandani et al. | |
| 7,572,110 B2 * | 8/2009 | Bernard | F04B 19/006 |
| | | | 417/208 |

(Continued)

OTHER PUBLICATIONS

International Search Report, dated Sep. 9, 2021, issued in corresponding International Application No. PCT/US2022/043069, 3 pgs.

(Continued)

*Primary Examiner* — Bryan M Lettman
(74) *Attorney, Agent, or Firm* — Panitch Schwarze Belisario & Nadel LLP

(57) ABSTRACT

A nano gas pump for generating gas flow, gas compression and gas rarefication which provides up to several orders of magnitude pressure difference, operates over a wide range of pressure from several millitorr to several atmospheres, and with pumping speeds from several nano liters to several liters per minute. The nano gas pump does not require any moving parts and generate gas flow using steep temperature gradients of more than 100 milli Kelvin over a mean free path of the local gas in the direction of the gas flow. Temperature gradients are created and restricted mostly to the gas doing the work, through an arrangement of PNP, NPN, PP, NN thermoelectric segments together with conductive interconnects. Contact resistance which drastically reduces the efficiency of a nanoscale thermoelectric heat pump is mitigated by overlapping thermoelectric segments and electric connections.

18 Claims, 37 Drawing Sheets

(56) References Cited

U.S. PATENT DOCUMENTS

| | | | |
|---|---|---|---|
| 7,980,828 B1 | 7/2011 | Lantz et al. | |
| 8,235,675 B2 | 8/2012 | Gianchandani et al. | |
| 8,607,450 B2* | 12/2013 | Cassemeyer | F04B 19/006 |
| | | | 977/906 |
| 9,695,807 B2 | 7/2017 | Kloss et al. | |
| 2004/0179946 A1* | 9/2004 | Gianchandani | F04B 43/043 |
| | | | 417/207 |
| 2004/0244356 A1 | 12/2004 | Ronney | |
| 2006/0078434 A1* | 4/2006 | Kim | F04B 43/06 |
| | | | 417/51 |
| 2006/0147741 A1 | 7/2006 | Ho et al. | |
| 2010/0059723 A1* | 3/2010 | Lee | H10N 10/852 |
| | | | 252/521.3 |
| 2011/0240622 A1* | 10/2011 | Sanchez | H10N 10/00 |
| | | | 219/201 |
| 2012/0207625 A1 | 8/2012 | McNamara et al. | |
| 2014/0056654 A1* | 2/2014 | Zonenberg | B65G 51/03 |
| | | | 406/88 |
| 2014/0075917 A1* | 3/2014 | Zonenberg | F03H 1/0018 |
| | | | 60/204 |
| 2014/0076411 A1* | 3/2014 | Zonenberg | G05D 16/20 |
| | | | 137/565.23 |
| 2014/0083291 A1* | 3/2014 | Zonenberg | B01D 35/26 |
| | | | 55/467 |
| 2014/0084115 A1* | 3/2014 | Sanchez | B64C 9/00 |
| | | | 244/76 R |
| 2014/0161633 A1* | 6/2014 | Zonenberg | F04B 37/06 |
| | | | 417/207 |
| 2014/0166382 A1* | 6/2014 | Zonenberg | B60V 1/115 |
| | | | 180/128 |
| 2015/0176525 A1* | 6/2015 | Garbuz | F03H 99/00 |
| | | | 60/200.1 |

OTHER PUBLICATIONS

D. Jang, "Carbon nanotube-based field ionization vacuum", M.Eng Thesis, MIT, 2012, 105 pgs.

V. Jayanty, "Miniaturized electron-impact-ionization pumps using double-gated isolated vertically aligned carbon nanotube arrays", M.S. Thesis, MIT, 2012, 71 pgs.

* cited by examiner ns from
APPARATUS AND METHOD OF OPERATING A GAS PUMP

TECHNICAL FIELD

The present disclosure relates to the field of micropumps intended for providing gas flow, gas rarefaction, gas compression and maintaining a specified pressure or pressure difference, as well as methods of using and manufacturing the same

BACKGROUND

Dynamic control of gas flow is desired for a wide range of applications. This includes applications where the flow of gas is a direct mechanism as in propulsion systems, gas analyzers and mass flow controllers, and an indirect mechanism as in pneumatically driven systems, such as micropumps, and lab-on-a-chip.

Dynamic control of large-scale gas flows is an established field with dominating technologies being rotary vane, screw, scroll, turbofan, turbomolecular, diffusion, and cryogenic pumps. Such pumps are either used directly as in the case of propulsion, vacuum, and HVAC systems or indirectly where the gas is compressed or rarified in a separate volume and then introduced using valves, such as in pneumatic tools, pneumatic actuators, micro fluidics, nano fluidics and mass flow controllers.

Dynamic control of small-scale gas flows ranging from cubic nanometers to cubic centimeters per minute, in volumes that range from cubic nanometers to cubic millimeters, is relatively new technology demanded by medical, pharmaceutical, and micro propulsion fields (e.g., electronically controlled drug delivery patches, lab-on-a-chip and microdrones). It requires the miniaturization of various systems that enable the dynamic control of gas flows, and demands low power, high precision, in a small footprint and at a low price. Such challenges have been partially addressed over the last 20 years through various concepts and inventions, largely varying in efficiency and applicability. Most of these inventions can be placed into the following four categories with detailed examples given by E. Philip Muntz and Stephen E. Vargo in the chapter on Microscale Gas Pumps in The MEMs Handbook by CRC in 2002.

The first category of microscale gas pumps, is that of positive-displacement pumps, driven by vanes, scrolls, roots, claw, screws, diaphragms, membranes, or pistons. The primary principle of operation is the compression and expansion of the displacement volume through consecutive displacement of the diaphragm, membrane or piston. The frequency and amplitude of the membrane motion determine the performance of the pump. These pumps are often used directly to decrease the pressure of a volume for vacuum applications, inject gas for analysis, pressurize a volume for displacement of fluid, or pneumatic control of a mechanical system. One of the earlier versions of such a device was described by Roland Zengerle and Axel Richter in U.S. Pat. No. 5,529,465 for micro-miniaturized, electrostatically driven diaphragm micropump. Several commercial micro displacement pumps are available from various manufacturers such as TCS Micropumps Ltd, Binaca Pumps, Takasago Fluidic Systems and others.

The second category of microscale gas pumps is that of kinetic pumps such as vapor jet, diffusion, molecular drag, regenerative drag or turbomolecular. Like their larger analog, a turbomolecular pump, these pumps drive gas molecules by repeated collisions with a rapidly moving solid surface. A rapidly spinning rotor pushes gas molecules from the inlet of the pump toward the exhaust, thus creating a pressure difference, such pumps are capable of create a pressure differential of at least an order of magnitude, and performance per square centimeter of pump operating area can exceed 100 mL/min. Rotary pumps are difficult to make very small, not only because of the need to use precise micromachining, but also because their performance drops roughly as the radius cubed. An example of a miniaturized rotary pump was developed by the Honeywell Corporation and consists of about 2,000 blades squeezed into a 25 mm diameter, 2.5 mm thick plate. Wei Yang and Ruofu Xiao describe it in more detail in "Multi-objective optimization design of a pump-turbine impeller based on an inverse design using a combination optimization strategy" published by the journal of fluids engineering in 2014.

The third category of microscale gas pumps is that of capture pumps such as cryopumps, getters, sputter ion, orbitron ion, and other ionization pumps. These pumps operate by ionizing gas molecules, and then using electric fields to accelerate the ions toward a surface where they become trapped, thereby removing the ions from the evacuated volume. Such micropumps are still at their early development stages.

Examples include "Carbon nanotube-based field ionization vacuum", by D. Jang, M. Eng A Thesis, MIT, 2012, and "Miniaturized electron-impact-ionization pumps using double-gated isolated vertically aligned carbon nanotube arrays", by V. Jayanty, M. S. Thesis, MIT, 2012.

The fourth category of microscale gas pumps are thermal diffusion pumps that contain no moving components and no moving auxiliary fluid or gas species. The mechanisms are also referred to as thermal transpiration, molecular transpiration, and thermal creep. Originally the phenomenon was associated with gas effusion through small holes and long channels and described as gas motion between two chambers connected by a porous material with a pore size smaller than the gas mean free path by E. H. Kennard, in Kinetic Theory of Gases, McGraw Hill, 1938. More recently, transpiration has sometimes been understood in terms of thermal diffusion, i.e., the existence of a thermal force on a gas initiated only by temperature differences, and in the absence of any pressure difference in that gas. The second mechanism, thermal creep, first theoretically explained by physicist James Clerk Maxwell and originally called thermal transpiration by physicist Osborne Reynolds, is the phenomenon of gas motion initiated by the temperature gradients along a wall wherein the gas creeps in the direction from cold to hot.

The discovery of transpiration and thermal creep phenomena has led to the theoretical development and practical implementation of the Knudsen Compressor, a device drafted over a hundred years ago by Martin Knudsen and described in "Eine Revision der Gleichgewichtsbedingung der Gase Thermische Molekularströmungund", published in 1910 in the annalen der physick. Martin Knudsen studied differentially heated and cooled capillaries to produce a staged compressor, and much later this was adapted to microscale by G. Pham-Van-Diep, P. Keeley, E. P. Muntz, D. P. Weaver, in "A Micromechanical Knudsen Compressor" in Rarefied Gas Dynamics in 1995 by Oxford University Press. E. P. Muntz outlined a micro-electromechanical molecular-transpiration Knudsen compressor capable of generating large changes in pressure by utilizing a cascade of multiple stages. Each stage is composed of a capillary and connector section. A temperature increase across the capillaries results in a pressure increase driven by thermal transpiration. The capillary section is followed by a connector section where the pressure is approximately constant while the temperature drops toward its original value entering the stage. The manufacturing details were described by S. E. Vargo, E. P. Muntz and G. R. Shiflett in U.S. Pat. No. 6,533,554 for Thermal transpiration pump. Later, some modifications to the concept were made by Y. B. Gianchandani and S. P. McNamara at the University of Michigan and described in U.S. Pat. No. 7,367,781 for Packaged micromachined device such as a vacuum micropump, device having a micromachined sealed electrical interconnect and device having a suspended micromachined bonding pad. Y. B. Gianchandani, and N. Gupta also described in U.S. Pat. No. 8,235,675, System and method for providing a thermal A transpiration gas pump using a nanoporous ceramic material. In the latter work, a micropump was proposed made of porous ceramic materials such as zeolite to constrain the flow of gas molecules to the free molecular or transitional flow regime. An alternative design of a multi-staged micropump was proposed by Y. Y. Kloss, F. G. Cheremisin and D. V. Martynov and described in U.S. Pat. No. 9,695,807 for gas micropump. The patent of Kloss et al described a configuration that includes continuous cylindrical separating pipes having at least two alternating stages of pipes of small radius and large radius connected in succession. One end of the pipes constitutes a hot zone, and the opposite end constitutes a cold zone. Such pipes alternate straight pipes with a large radius and U-shaped curved pipes with a small radius. Another configuration for thermal transpiration micropumps was proposed by R. Bernard and H. Kambara in U.S. Pat. No. 7,572,110 for a Pumping A apparatus using thermal transpiration micropumps. Therein, each micropump comprised at least one cavity with an inlet connected to an inlet channel of a small cross-section and an outlet connected to an outlet channel. It also included a heater element for heating the segment of the inlet channel that is adjacent to the cavity, and a plurality of such micropumps were connected in series. Another micro-electromechanical pump was described by J. W. Lantz and H. L. Stalford in U.S. Pat. No. 7,980,828 titled Microelectromechanical pump utilizing porous silicon. The design included a porous silicon region sandwiched between an inlet chamber and an outlet chamber. The porous silicon region was formed in a silicon substrate and contains pores extending between the inlet and outlet chambers, with each pore having a cross-sectional dimension approximately equal to or smaller than the mean free path of a gas being pumped. Another machined thermal diffusion pumps was presented by Q. Cheng, Y. Qin and Y. B. Gianchandani from the University of Michigan at the 2017 IEEE 30$^{th}$ international conference on MEMS in Las Vegas, NV where they used mixed cellulose-ester membranes as the core of a micro-machined pump which reduced power requirements, titled "A bidirectional Knudsen pump with superior thermal management for micro-gas chromatography applications." Other micro thermal diffusion pumps have been proposed and demonstrated, however as of 2022, there are no thermal diffusion pumps on the market.

Two major challenges for commercializing thermal diffusion pumps are the power requirements and manufacturing complexity. In 2009, D. Copic and S. McNamara derived from first principles the maximum efficiency of a thermal diffusion heat engine operating on dry air as 28.36%, in a paper titled "Efficiency derivation for the Knudsen pump with and without thermal losses", JVST 2008 However, some of the latest work out of the University of Michigan by Q. Cheng, et al, only produced a maximum air flow of 0.82 standard cubic centimeters (sccm) at a maximum blocking pressure of 880 pascals (Pa) using 2 watts (W). Since blocking pressure is linear with the gas flow rate, the maximum efficiency is found at 0.41 sccm and 440 Pa at 2 W.

$$\text{Efficiency}_{(UMich\ 2017)} := \frac{0.42\ sccm \cdot 440\ Pa}{2W} = 0.00015\%$$

At 2 W the hot side temperature was 65.7° C., and the cold side temperature was 42.5° C., for a temperature difference of 23.2 kelvin (K), the maximum Carnot heat engine efficiency at these temperatures is ~6.8%.

$$\text{Efficiency}_{(MAX\ Carnot\ Heat\ Engine)} := \frac{65.7°\ C. - 42.5°\ C.}{65.7°\ C.} = 6.847\%$$

Therefore, when comparing the efficiency of the thermal diffusion heat engine, to the max Carnot heat engine efficiency at the operating temperatures, we can compare the thermal diffusion heat engine efficiency as a percent of maximum Carnot heat engine efficiency at the operating temperatures. In this case it is about ~0.002%. This is a useful metric since when using thermoelectric heat pumps to generate the temperature gradients, the round-trip efficiency stays relatively flat for a significant range of the operating temperature differences, and it provides a quantitative metric to compare various thermal diffusion heat engines operating with different temperature gradients.

The second major challenge is scaling production of a thermal diffusion micropump. This is largely due to the availability of commercially available systems and processes that can create precise nanostructures at commercially viable costs. The main culprit is the use of non-standard materials that are not available commercially. Over $1 trillion was spent developing silicon-based nanotechnology, which now permeates our lives. Novel materials do not have this luxury of scale and therefore require greater investment in CapEx and R&D to create compelling and competitively priced nanopumps. In exemplary embodiment we address this challenge using silicon germanium and silicon based thermoelectric materials, and it is to be understood the exemplary choice of thermoelectric materials is not limiting the choice of thermoelectric materials to fabricate the nano gas pump.

Therefore, in summary, dynamic control of pressure in small volumes is a field of active research with a wide range of applications, and one of the most promising technologies is a thermal diffusion gas pump, that until now has been limited by low efficiency and manufacturing complexity.

SUMMARY

Exemplary embodiments disclosed herein may alleviate the low efficiency and mass production challenges of the previously proposed thermal diffusion heat engine designs discussed above. The primary bottleneck of these designs involves narrow tubes or channels for gas passage that connect the heated and unheated chambers.

Such channels, either micro-machined or inherently present in porous materials separating the chambers, while driving the pressure difference, greatly reduce the mass flow rate and drive manufacturing complexity.

Before explaining at least one exemplary embodiment of the present disclosure in detail, it is to be understood that the present disclosure is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary objective of exemplary embodiments of the disclosed technology are the effective designs of a thermoelectric heat pump integrated into a thermal diffusion heat engine, in order to provide for gas flow and gas compression performance that overcomes shortcomings of prior art devices. One aspect involves replacing the long and narrow connector tubes with thermoelectric materials that create thermal gradients in the general direction of the desired gas flow, while minimizing loses resulting from temperature gradients in parts of the heat engine that is not doing work, and reducing material required in the sidewall of the pumping channel, which while critical for structural and manufacturability purposes, significantly increases heat loses.

Disclosed herein are methods and exemplary embodiments of an apparatus for creating gas flow and gas compression. In an exemplary embodiment, an apparatus comprises of at least two volumes, at least one aperture in the surface that separates the volumes for gas to communicate through, and at least one thermoelectric segment between the two volumes and a device communicatively connected to the thermoelectric segments and configured to provide an electric current. The electric current supplied to thermoelectric elements establishes thermal gradients across the aperture connecting the two volumes. The thermal gradient in turn, results in a flow of gas from one volume, through the aperture and into the next volume in the general direction of the temperature gradient. The thermoelectric elements are configured to provide a thermal gradient of at least 100 milli kelvin (mK) per mean free path of the local gas. A common feature of most practical embodiments of the apparatus is that the length of the aperture between the two volumes is less than 100 local mean free paths, with shorter distances resulting in higher flow rates at the expense of manufacturing complexity and sensitivity to parasitics such as electrical contact resistance, and near field radiation. Ideally, the target distance between the two hot and cold ends of the aperture is optimized based on performance requirements. In an exemplary embodiment of nano gas pumps pneumatically driving a 1 mm diameter valve to restrict or allow the flow of fluid in a standard temperature and pressure environment, such as in case with a "Quake valve", the length of the aperture is less than 5 microns (µm), the sidewall is less than 50 nanometers (nm), and the diameter is less than 1 µm.

The operation of the thermoelectric or Peltier element herein is based on the reverse phenomenon of the Seebeck effect; the electrical current flowing through the junction connecting two materials with different Seebeck coefficients will emit or absorb phonons proportional to the current at the junction to balance the difference in the chemical potential of the two materials. Therefore, there are many pairs of electrically conductive or semiconductive materials with different chemical potentials that are chemically stable in a surrounding gas to be pumped can be used to build thermoelectric elements pertinent to present disclosure. When scaling the nano gas pumps down, electric contact resistance becomes one of the main sources of inefficiency. Therefore, materials and processes that have been developed to minimize electrical contact resistances at the nano scale are advantageous even if the thermoelectric efficiency of the material pair is lower than other material choices. Examples of material pairs that have been optimized for mass production include p-type silicon, n-type silicon and p-type silicon germanium, n-type silicon germanium.

In another embodiment the apparatus includes a sequence of fluidically connected volumes, with apertures serving as passages for gas between the adjacent chambers. In yet another embodiment disclosed herein, an array of sequences operating in parallel is described. Other objects and advantages of the present disclosure will become evident to the reader, and it is intended that these objects and advantages are within the scope of the present disclosure.

BRIEF DESCRIPTION OF THE DRAWINGS

The present methods, apparatuses and systems will now be described by way of exemplary embodiments to which the invention defined by the claims appended hereto are not limited. The details of one or more exemplary embodiments of the disclosure are set forth in the accompanying drawings and the description below. Other features, objects, and advantages will be apparent from the description and the drawings, and from the claims.

DETAILED DESCRIPTION

Figure 1A:
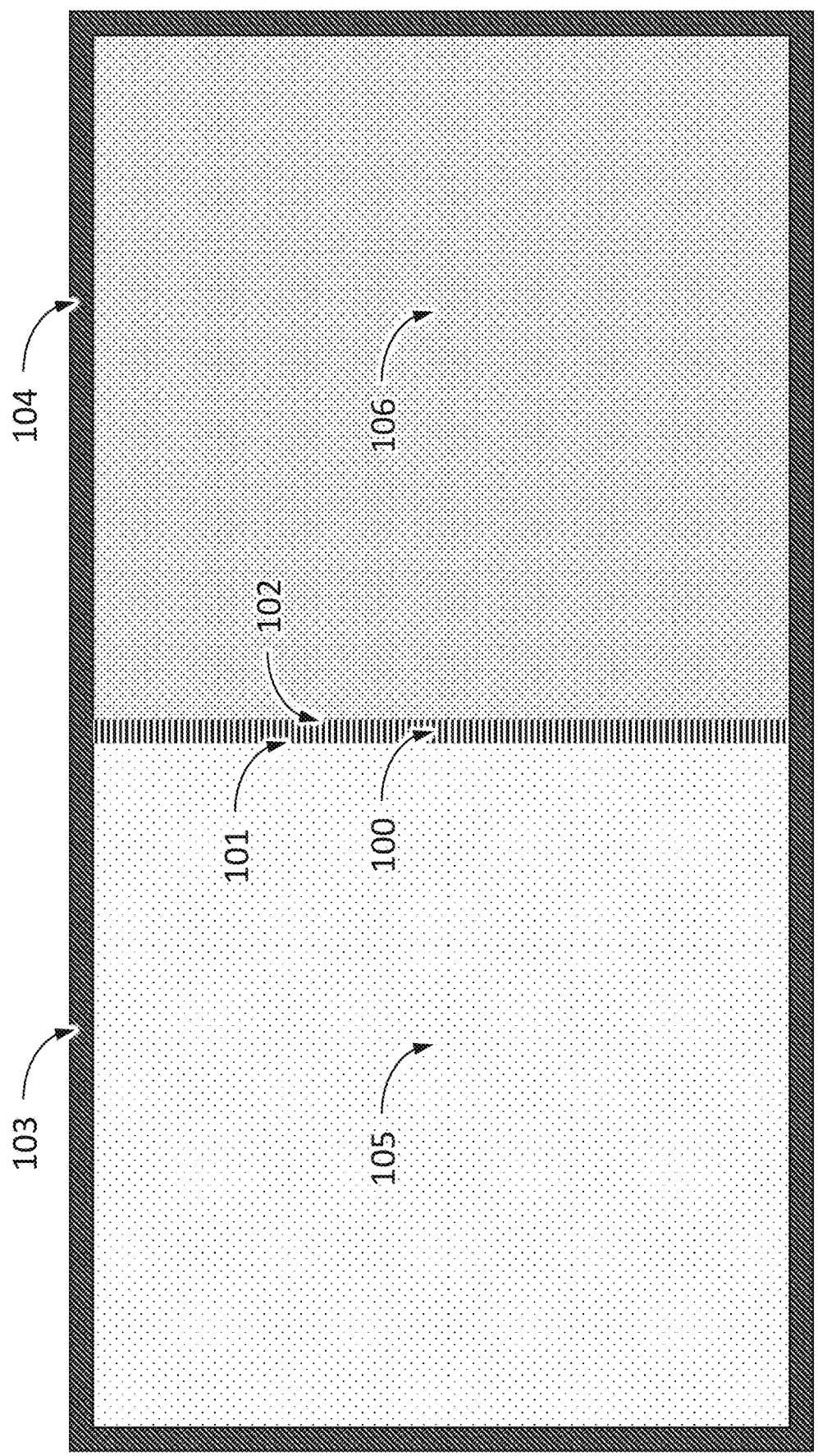
FIG. 1A describes an elementary apparatus for creating and maximizing a pressure difference in the gas and FIG. 1B describes an elementary apparatus for creating and maximizing gas flow velocity.

Disclosed herein is an apparatus with no moving parts for the purpose of generating temperature gradients in a gas in the transitional and free molecular regime for the purpose of moving gas, controlling pressure, generating a force, and separating molecules by mass. Further disclosed are exemplary embodiments for creating gas flow, compressing, and partially evacuating a gas in an enclosed volume, pneumatically influencing mechanical motion, such as in microfluidic systems, and creating a force to move an air vehicle.

Different terms have been used to describe the various aspects of this phenomena, including thermal diffusion, thermal transpiration, thermal creep, and radiometric force. To reduce confusion, we will refer to these phenomena as thermal diffusion. For historical context, Knudsen pumps have been used to demonstrate the movement of gases in a narrow channel in the presence of a temperature gradient. The Crookes radiometer has been used to demonstrate forces on a vane, in the presence of a temperature gradient at the appropriate length scale. Thermal diffusion was one of the original methods used to separate uranium 235 and today it remains a practical process to separate isotopes of noble gases and other light isotopes for research purposes.

A temperature gradient is created in the volume of the membrane [100] separating the first volume [105] from the second volume [106] using a novel arrangement of thermoelectric materials. This temperature gradient is at least 100 milli kelvin (mK) per mean free path of the local gas. This induces a flow from cold to hot through the thermal diffusion of gas molecules. When operating in a pressure generating regime, for efficiency purposes, the diameter of the apertures in the membrane [100] and the thickness of the membrane [100] which separates the first [105] from the second [106] volume, may be optimized to ensure that the temperature gradients inside the membrane and perpendicular to the flow of gas are minimized. Practical tradeoffs such as fabrication complexity, including cost, manufacturing time, complexity and thermoelectric heat pump efficiency may be optimized based on application requirements.

In exemplary embodiments, a large range of performance can be achieved. With sufficient properly configured stages in series, gas in an enclosed volume can be evacuated down to several millitorr or pressurized to multiple atmospheres. With sufficient stages in parallel, gas flow rate can range from several nanoliters per minute to several liters per minute. Several multi-stage designs are possible, including straight flow, turn flow and a combination thereof.

Exemplary embodiments described herein are aimed at reducing the inherent problems with current pump technologies based on thermal diffusion, in particular, large size and low efficiency, which further places practical limits on the mass flow and pressure difference achievable with current technologies. The primary bottleneck are the fabrication and material constraints which require the use of long, narrow channels that greatly reduce mass flow or thick thermoelectric sidewalls [203], [206] required for structural stability of the heat pump that increase thermal losses leading to reduced efficiency.

Exemplary embodiments described herein avoid such bottlenecks through the novel use of complementary thermoelectric materials which enable the use of incredibly thin thermoelectric or electrically conductive sidewalls in the apertures, in the membrane [100] separating the first [105] and second [106] volume, while maintaining structural stability. This enables the use of commercially available materials and processes that result in low contact resistances in materials such as silicon germanium.

Figure 2A:
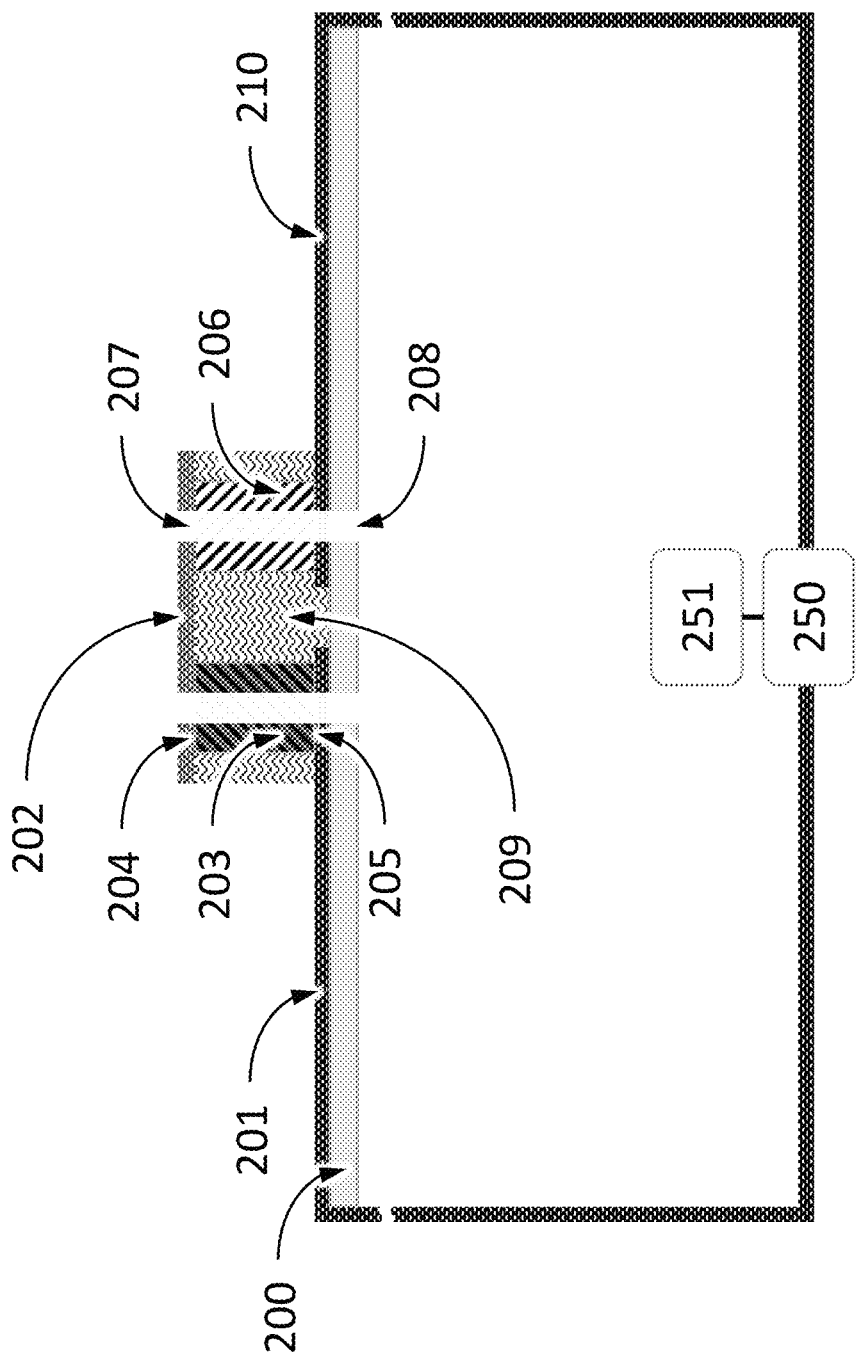
FIG. 2A describes a cross sectional view and FIG. 2B describes a top-down view of an elementary part of an apparatus for creating a temperature gradient in the gas to create gas flow and or a gas pressure difference using a p-type and n-type thermoelectric element.

Perhaps one of the more underappreciated challenges in reducing the distance (h) between the hot ($T_{hot}$) and cold ($T_{cold}$) sides of a thermoelectric heat pump [FIG. 2A] is that of contact resistance ($R_c$). The voltage of a thermoelectric element [203, 206] at the maximum temperature drop ($V_{MAX}$) is the just product of the Seebeck voltage (a) and the hot side temperature ($T_{hot}$), therefore the current (I) for the same cooling ($Q_c$) and heating ($Q_h$) performance in an ideal thermoelectric heat pump when using the same materials may be the same.

$$V_{MAX} = \alpha \cdot T_{hot}$$

$$Q_c = \alpha \cdot I \cdot T_{cold} - \frac{1}{2} \cdot I^2 \cdot R - I^2 \cdot R_c - K \cdot (T_{hot} - T_{cold})$$

$$Q_h = \alpha \cdot I \cdot T_{hot} + \frac{1}{2} \cdot I^2 \cdot R + I^2 \cdot R_c - K \cdot (T_{hot} - T_{cold})$$

$$R = \frac{\rho \cdot h}{A} \quad R_c = \frac{r_c}{A_c} \quad K = \frac{\kappa \cdot A}{h}$$

When reducing the distance between the hot ($T_{hot}$) and cold ($T_{cold}$) ends (h) of a thermoelectric element, the resistance (R) is reduced by the same factor, and therefore inversely increases the current (I) required to get to the same voltage. Now for same heat transfer performance for cooling ($Q_c$) and heating ($Q_h$), the area (A) of the thermoelectric is reduced by the same factor. The result is the same current (I) at the same cooling ($Q_c$) and heating ($Q_h$) performance regardless of the height (h) of the thermoelectric elements. Since contact resistivity ($r_c$) is in units of resistance by area ($\Omega \cdot cm^2$), reducing the thickness (h) of the thermoelectric from industry standard of 1 mm by a factor of a thousand to 1 µm, and the corresponding area (A) by the same factor, results in additional losses from contact resistance ($R_c$) by the same factor, which may greatly reduce the efficiency of the thermoelectric heat pump. Therefore, when reducing to practice any exemplary embodiments, it may be necessary to minimize inherent contact resistivities ($r_c$), as well as increase the contact area ($A_c$). Exemplary embodiments, teach several mechanisms for reducing contact resistance by increasing contact area ($A_c$) and methods for reducing inherent contact resistivities (re) are already known for those skilled in the art of reducing semiconductor contact resistivities. Proper management of contact resistances further enables reducing the distance between the hot and cold sides, which increases the thermal gradient, which increases the mass flow performance of the nano gas pump.

Ideally, temperature gradients are isolated to the gas doing the work. However, fabrication complexity of ideal geometries, economics and other factors often require tradeoffs. Large plates held at different temperatures, and or driven by thermoelectric elements with excessive area perpendicular to the flow of current, lead to unnecessary heating and cooling when reduced to practice in the manner as they have been disclosed, as is the case of other thermal diffusion gas pumps that can use thermoelectric heat pumps such as the ones described here:

Jason Sanchez, Piotr Garbuz and Andrew Zonenberg in U.S. Pat. No. 9,845,796 for a Nanomolecular solid state electrodynamic thruster.

Shamus McNamara and Kunal Pharas in U.S. Pat. No. 9,243,624, for a Thermally driven Knudsen pump.

C. H. Ho, S. Y. Chen, H. H Hsu, J. T. Yang and C. Chen in U.S. patent application Ser. No. 11/302,818 for a Composite plate device for thermal transpiration micropump.

Roland Bernard and Hisanori Kambara in U.S. Pat. No. 7,572,110 for a Pumping apparatus using thermal transpiration micropumps.

Marco Scandurra in U.S. patent application Ser. No. 11/068,470 for a Radiometric propulsion system.

Only the edges of the plate immediately adjacent to the apertures through which gas flow should be held at a different temperature. While the terms "adjacent" and "immediately adjacent" are used hereinafter, note that thermoelectric elements do not necessarily need be exposed to the ambient gas, and may have a thin coating of protective material, preferably with low thermal conductivities such as silicon oxide, hafnium oxide, parylene, or similar, to protect from corrosion caused by reactive components in the pumped gas, and to reduce stray currents by electrically isolating exposed electrical conductors. Exemplary embodiments teach how to minimize the undesired heating and cooling of the gas using a novel complementary arrangement of thermoelectric materials.

Principles of Operation

Gas behaves like a fluid when forces acting on the gas do so at large scales. When forces acting on a gas do so at scales on the order of the mean free path of the gas, the gas should no longer be treated at a macroscopic level as a fluid, and instead should be treated at a microscopic level as individual particles, exhibiting unique behaviors. The mean free path (λ) of a gas may be approximated using the hard sphere model where (n) is the number density and (d) is the molecular diameter. The number density (n) of the gas can be calculated the ratio of the Boltzmann constant ($k_B$) by the ambient temperature (T), over the ambient pressure (P).

$$\lambda = \frac{1}{\sqrt{2} \cdot \pi \cdot d^2 \cdot n}$$

$$n = \frac{P}{k_B \cdot T} \quad P = n \cdot k_B \cdot T$$

At standard atmospheric conditions, the molecular mean free path is approximately 67 nm, and any flow with characteristic scales less than a few microns needs to be treated at the microscopic level. One of the most useful behaviors that emerge at these scales is the difference in pressure when two volumes are held at different temperatures as shown in FIG. 1A. Here we have a membrane (100) separating a hot volume (105) and a cold volume (106). A hot wall (103) encloses the hot volume (105), and the cold wall (104) encloses the cold volume (106). The membrane (100) further has a hot side (101) and a cold side (102).

Equilibrium is achieved when the molecular flux from the hot side to cold side ($\phi_h$) is equal to the molecular flux from cold side to hot side ($\phi_c$), where ($A_a$) is the total area of the apertures in the membrane (100). Molecular flux (φ) in the absence of bulk velocities is proportional to the product of the number density (n) and average thermal speed of the gas ($\bar{v}$). The average thermal speed of the gas ($\bar{v}$) is proportional to the square root of the ratio of temperature (T) and the molecular mass (m) of the molecule.

$$\bar{v} = \sqrt{\frac{8 \cdot k_B \cdot T}{\pi \cdot m}}$$

$$\phi_h = \frac{1}{4} \cdot \frac{P_h}{k_B \cdot T_h} \cdot A_a \cdot \sqrt{\frac{8 \cdot k_B \cdot T_h}{\pi \cdot m}}$$

$$\phi_c = \frac{1}{4} \cdot \frac{P_c}{k_B \cdot T_c} \cdot A_a \cdot \sqrt{\frac{8 \cdot k_B \cdot T_c}{\pi \cdot m}}$$

Classically, in the process of equilibration, gas tends to decrease the pressure difference between adjacent gas regions, however, in the presence of temperature differences over a mean free path ($\lambda$), the pressure difference never goes to zero. This is because number density (n) is proportional to (T), while velocity is to the square root of (T). Therefore, when the hot volume (105) and cold volume (106) are held at different temperatures, then the maximum ratio of the pressure of the hot volume ($P_h$) and the pressure of the cold volume ($P_c$), will be proportional to the square root of the ratio of the temperature of the hot volume ($T_h$) and the temperature of the cold volume ($T_c$). An important note is that the membrane (100) is an ideal membrane, such that particles passing through the hot side of the membrane (101) do so at the temperature of the hot side ($T_h$), and particles passing through the cold side of the membrane (102) do so at the temperature of the cold side ($T_c$).

$$\frac{1}{4} \cdot \frac{P_h}{k_B \cdot T_h} \cdot A_a \cdot \sqrt{\frac{8 \cdot k_B \cdot T_h}{\pi \cdot m}} = \frac{1}{4} \cdot \frac{P_c}{k_B \cdot T_c} \cdot A_a \cdot \sqrt{\frac{8 \cdot k_B \cdot T_c}{\pi \cdot m}}$$

$$\frac{P_h}{P_c} = \sqrt{\frac{T_h}{T_c}}$$

Figure 1B:
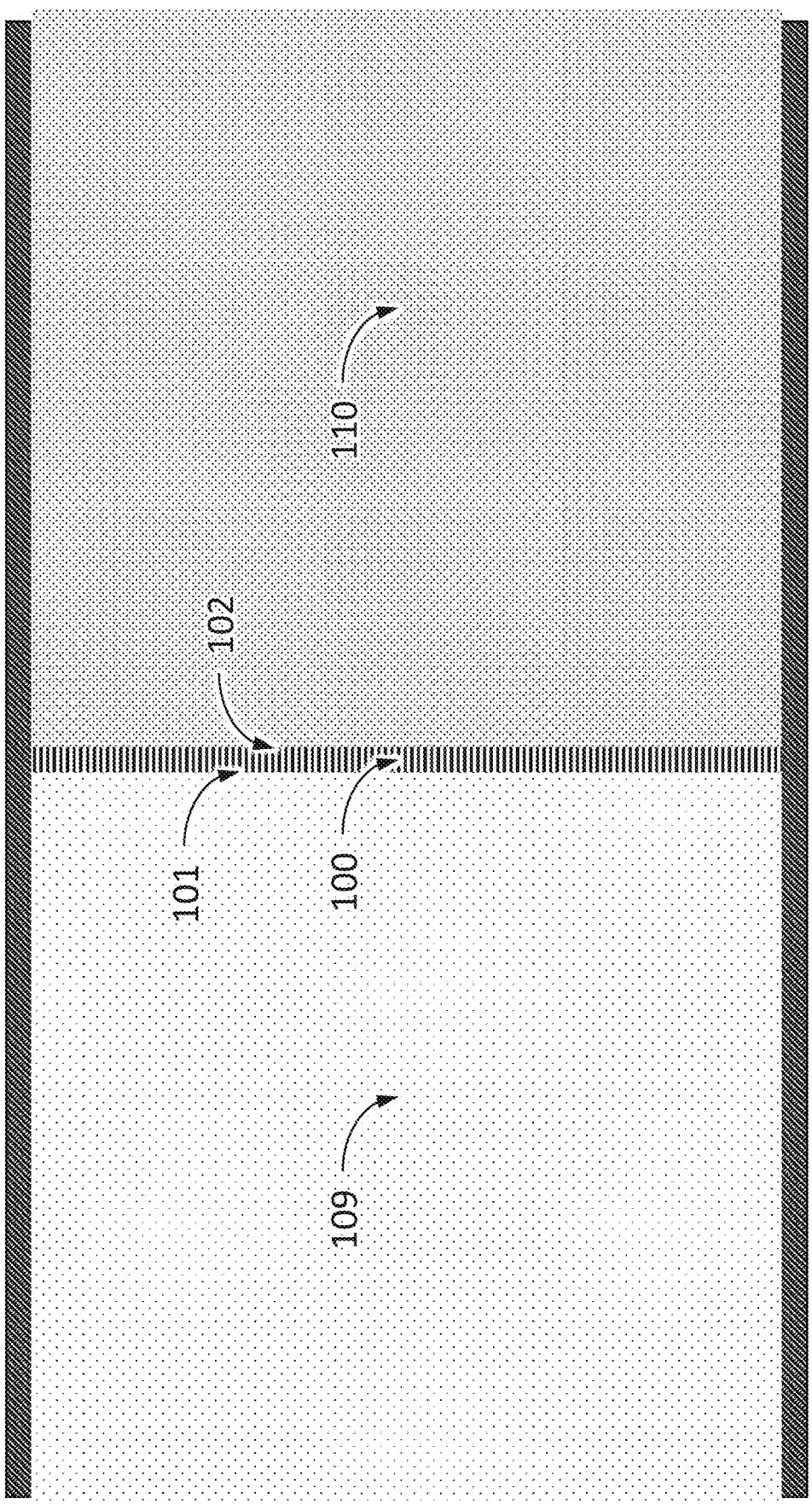

When the first volume (109) and the second volume (110) are not enclosed (FIG. 1B), then the pressure gradient will not reach the maximum, and there will be a flow from the cold side of the membrane (102) to the hot side of the membrane (101), where the flow rate from thermal diffusion will roughly be a function of the established pressure difference between the hot side (101) and the cold side (102) and the temperature difference over a mean free path ($\lambda$).

Figure 2B:
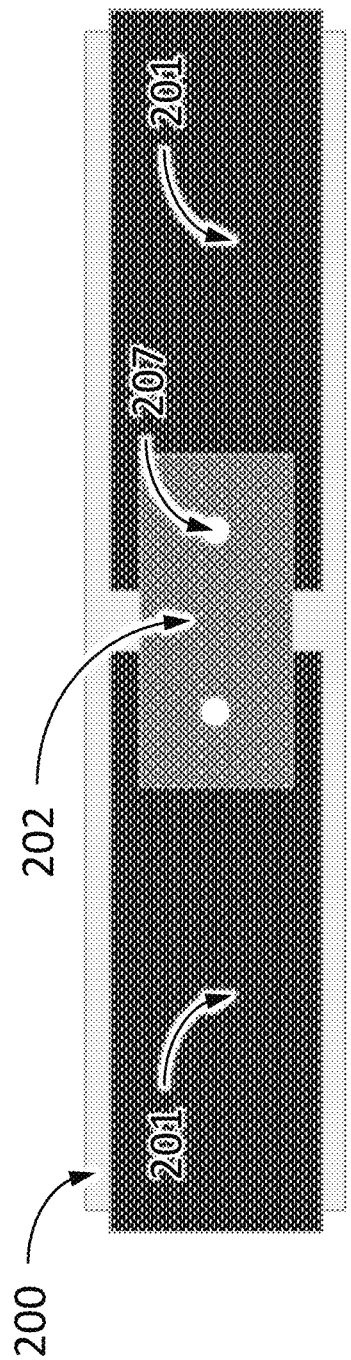

This phenomenon is described in detail by X. Wang, T. Su, W. Zhang, Z. Zhang and S. Zhang in "Knudsen pumps: a review", published in 2020 in Nature and by A. Ketsdever, N. Gimelshein, S. Gimelshein, and N. Selden in "Radiometric Phenomena: From the 19$^{th}$ to the 21$^{st}$ Century", published in 2012 in Vacuum Efficiently establishing and maintaining a large temperature gradient across short distances requires the application of thermoelectric heat pump as shown in FIG. 2A and FIG. 2B. In this exemplary embodiment, a substrate (200) is communicating with the environment and serves as a heat sink to extract excess heat away from the thermoelectric heat pump. The heat pump consists of a P-type thermoelectric element (203), and an N-type thermoelectric element (206). A first interconnect (201), a second interconnect (202) and a third interconnect (210) form a circuit with the two thermoelectric elements (203, 206) and a power supply (250) which may include a microcontroller (251) and may include software, encryption, storage, memory, wired or wireless network connection, sensors, switches, software, power supplies, batteries, human machine interfaces, packaging, and other components familiar to those skilled in the art of designing consumer, medical and industrial electronics. Hereafter, the power supply (250) and related optional components (251) will be referred to as power supply.

When the power supply (250) applies an appropriate positive voltage to the first interconnect (201) and closes the circuit through the third interconnect (210), heat starts pumping from the bottom of the p-type thermoelectric element (205) to the top of the p-type thermoelectric element (204). This direction of heat flow is reversed for n-type thermoelectric element (206). This reduces the temperature of the substrate (200) and increases the temperature of the second interconnect (202). This causes a flow of gas from the bottom of the aperture (208) to the top of the aperture (207). If current flow is reversed, heat is pumped from the second interconnect (202) to the substrate (200) and reverses the flow of gas so that it now flows from the bottom of the aperture (208) to the top of the aperture (207). When using alternating p-type (203) and n-type (206) thermoelectric elements, a larger temperature difference will form when pumping heat out of the substrate (200) than when pumping heat into the substrate (200). When there is a temperature difference between substrate (200) and the second interconnect (202), heat will naturally flow from cold to hot, through the p-type thermoelectric element (203), the n-type thermoelectric element (206) and the insulator (209) separating the substrate (200) from the second interconnect (202). Therefore, materials with low thermal conductivities should be chosen, and may include polymers such as parylene, polyimides and others, oxides such as silicon oxide, hafnium oxide and others, aerogels, air, vacuum, and other low thermal conductivity materials and or a combination thereof.

The efficiency of a thermoelectric heat pump is limited by the figure of merit (ZT) of the thermoelectric material (203, 206). The figure of merit (ZT) is a function of temperature (T), Seebeck coefficient ($\alpha$), electrical resistivity ($\rho$) and thermal conductivity ($\kappa$) of the thermoelectric material. The thermoelectric material can be made of bismuth telluride, antimony telluride, silicon germanium, silicon, bismuth magnesium, graphene, nanotubes and other thermoelectric materials with a coefficient of performance (ZT) at room temperature of 0.01 or greater. This figure of merit (ZT) can also be roughly expressed as an efficiency fraction ($\varepsilon_{Carnot.HP}$) of the coefficient of performance of an ideal Carnot heat pump ($COP_{MAX.Heating}$).

$$ZT = \frac{\alpha^2 \cdot T}{\rho \cdot \kappa}$$

$$\varepsilon_{Carnot.HP} \cong \frac{\sqrt{1+ZT} - 1}{\sqrt{1+ZT} + 1}$$

$$COP_{MAX.Heating} = \frac{T_h}{T_h - T_c}$$

$$COP_{MAX.TE} = COP_{MAX.Heating} \cdot \varepsilon_{Carnot.HP}$$

For a bismuth telluride type material, with a figure of merit is around 1, and a hot side (204) of 25° C. and the cold side (205) of 20° C., the maximum coefficient of performance ($COP_{MAX.TE}$) is around 14. This can provide the nano gas pump with higher efficiencies and more design flexibility over resistive heaters. Proper design includes matching the performance of the thermoelectric heat pump to required heat flux of the gas, and making the appropriate tradeoffs for cost, manufacturability, and maximum temperatures of the substrates to achieve desired performance while maximizing efficiency. Appropriate voltage refers to the voltage range the thermoelectric heat pump is designed for and the voltage required to achieve the required performance. Furthermore, proper design and operation of thermoelectric heat pumps is known to those skilled in the art of thermoelectric heat pumps and semiconductor fabrication.

In the exemplary embodiment of a thermoelectric heat pump as shown in FIG. 2A and FIG. 2B, several major challenges arise. These include the extraction of excess heat through the substrate (200) generated by the thermoelectric heat pump. This excess heat is generated by resistive losses through the electrical interconnects, thermal electric materials, and electrical contact resistances. The amount of excess heat the substrate can remove depends on its thickness and its thermal properties. Since, the performance of the nano gas pump depends on shorter distances between the hot and cold sides, a thicker substrate reduces flow velocities and or efficiencies for the same temperature gradient. The substrate can be fabricated to reduce such losses, which adds to the manufacturing cost and complexity. Next, the thickness of the sidewalls of the p-type thermoelectric segment (203) and the n-type thermoelectric segment (206) provides critical structural support to the second electrical interconnect (202). Generally, the ideal sidewall thickness for a perfectly matched thermoelectric heat pump for the nano gas pump, is between 0.5 and 20 nm and sometimes as high as 100 nm, depending on the operating pressure and geometry chosen for of the apertures. This reduces the structural stability of the second interconnect (202) and increases the contact resistance at the top (204) and bottom (205) interfaces. Next, damage to the thermoelectric sidewalls, even in the presence of fault tolerant electrical distribution, reduces the pumping efficiency of the nano gas pump as it provides an unimpeded flow from the higher to the lower pressure volume and if the nano gas pump is bypassed, the nano gas pump aperture reduces the flow of gas. Next, this nano gas pump has a preferred gas pumping direction from the bottom of the substrate (208) to the top of the second interconnect (207), as a larger temperature difference will be established pumping heat out of the substrate (200) and heating the second interconnect (202), than pumping heat into the substrate (200) and cooling the top interconnect (202).

Exemplary Embodiment: PNP Nano Gas Pump

Figure 3A:
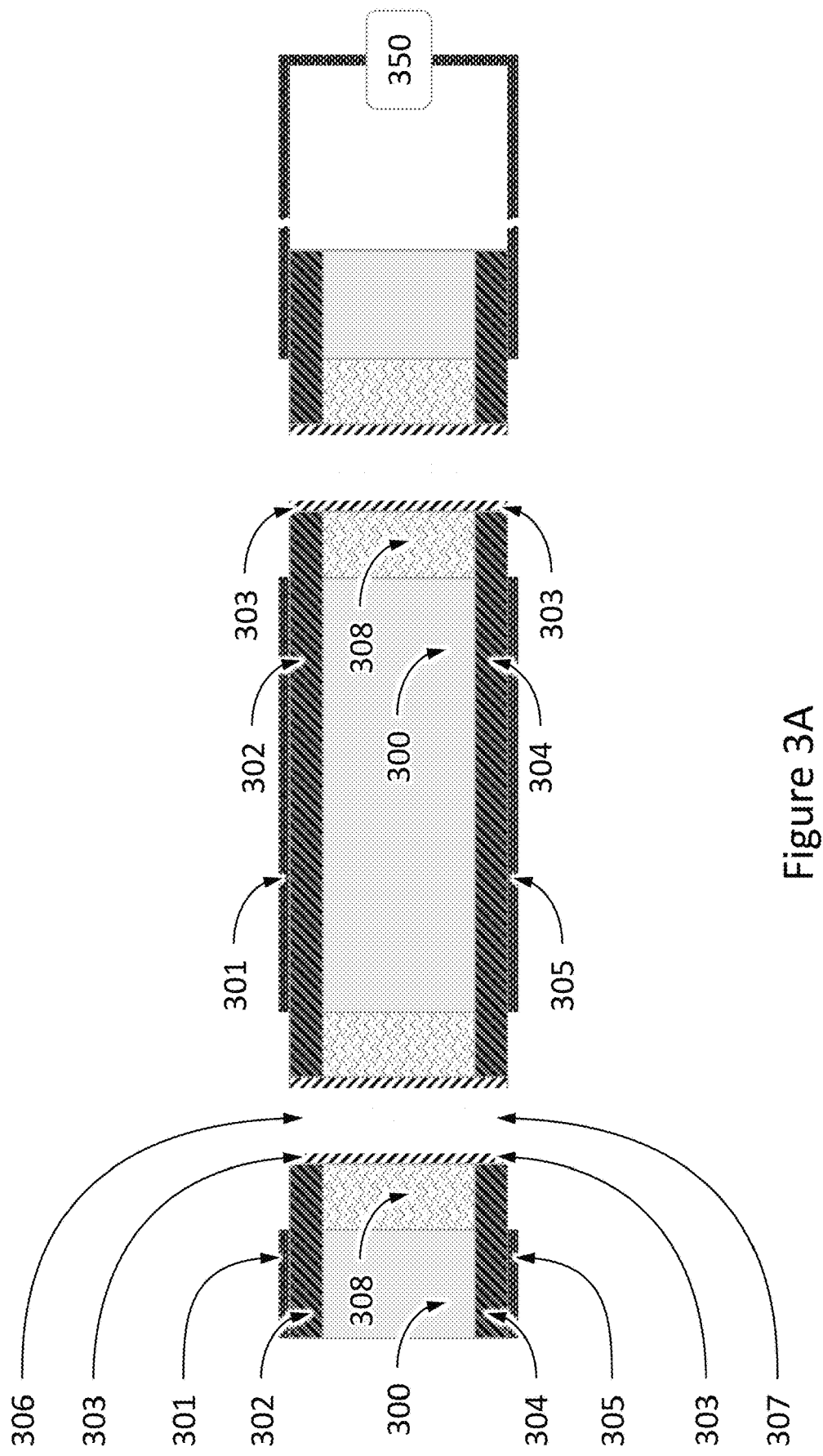
FIG. 3A describes a cross sectional view and FIG. 3B and FIG. 3C describes a top-down view of an optimized elementary part of an apparatus for creating a temperature gradient in the gas to create gas flow and or gas pressure different using complementary, p-type-n-type-p-type or n-type-p-type-n-type arrangement of thermoelectric elements.
Figure 3B:
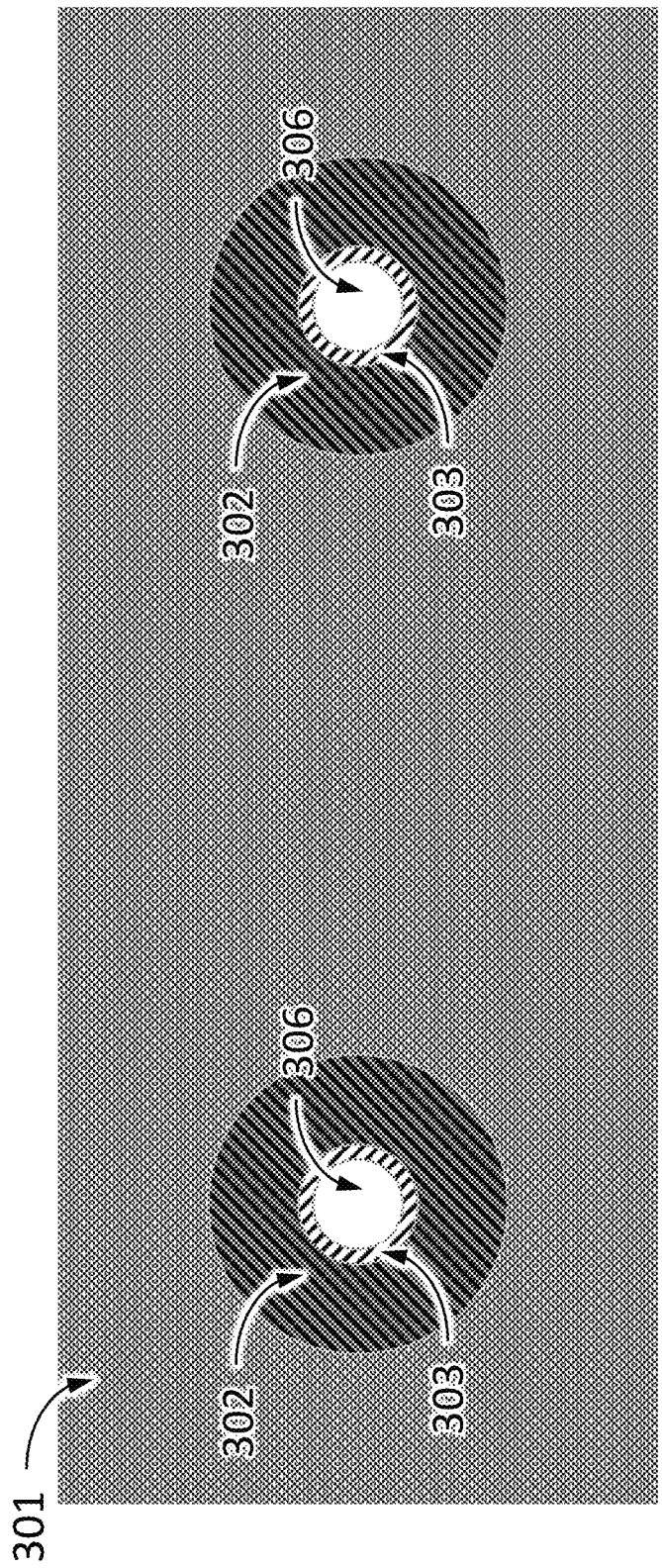
FIG. 3D describes a cross sectional view of an elementary part introduced in FIG. 3A and FIG. 3B that is further optimized for monolithic fabrication of an exemplary apparatus.
FIG. 3E describes a cross sectional view and FIG. 3F describes a top-down view of an elementary part introduced in FIG. 3A and FIG. 3B that is further optimized for thermal efficiency and monolithic fabrication of an exemplary apparatus.
FIG. 3G describes a cross sectional view of an elementary part introduced in FIG. 3A and FIG. 3B that is further optimized for the fabrication of an exemplary apparatus using p-type-metal-p-type or n-type-metal-n-type arrange of thermoelectric elements.

An exemplary embodiment of the proposed apparatus as shown in FIG. 3A and FIG. 3B reduces the performance limitations typically associated with a thermal diffusion gas pump utilizing a heat pump designed with alternating thermoelectric elements as previously shown in FIG. 2A and FIG. 2B. Here, the aperture of the nano gas pump (306, 307) is configured in the middle of the substrate (300). A first electrical interconnect (301) is layered over the first p-type thermoelectric material (302). This has several advantages, the first is a drastic reduction in contact resistance from the first interconnect (301) to the first p-type thermoelectric material (302), the second is a reduction in electrical resistance of the first interconnect (301), the third is a drastic reduction in interfacial thermal resistance between the first p-type thermoelectric material (302) and the substrate (300). The substrate has regions of low thermal conductivity materials (308) which houses the n-type thermoelectric material (303) which forms the aperture of the nano gas pump. The n-type thermoelectrical material (303) is connected to the first p-type thermoelectric material (302) and the second p-type thermoelectric material (304). A second electrical interconnect (305) is layered underneath the second n-type thermoelectric material (304). A power supply (305) completes the circuit between the first electrical interconnect (301) and the second electrical interconnect (305).

Applying an appropriate positive voltage to the first electrical interconnect (301), pumps heat from the substrate (300) and the first electrical interconnect (301) into the interface between the first p-type thermoelectric material (302) and the n-type thermoelectric material (303). Next, the n-type thermoelectric material (303) further pumps heat from the interface with the second p-type thermoelectric material (304) to the interface with the first thermoelectric material (302), Lastly, the second p-type thermoelectric material (304) pumps heat from the interface with the n-type thermoelectric material (303) and into the interface between the second thermoelectric material and the second electrical interconnect (305), as well as into the substrate (300). Properly designed and configured, this creates a thermal profile where the temperature is maximized at the interface between the first p-type thermoelectric material (302) and the n-type thermoelectric material (303) and minimized at the interface between the second p-type thermoelectric material (304) and the n-type thermoelectric material (303), when operating at the appropriate positive voltage at the first electrical interconnect (301). This creates a flow of gas from the bottom of the aperture (307) to the top of the aperture (306). The temperature gradient between the top of the aperture (306) and the bottom of the aperture (307) can be maximized further, at higher positive voltage at the first electrical interconnect (301) at the expense of the bottom aperture (307) experiencing higher temperatures than the substrate (300). While in certain cases this may reduce efficiency, it can provide extra performance in the form of higher gas flow rates and higher-pressure differences. As with many complex systems, robust Multiphysics simulation is useful for optimizing the design and operating parameters. Reversing the voltage at the first electrical interconnect (301), reverses the temperature gradient on the n-type thermoelectric material (303), which reverses the flow of gas so that it is pumped from the top of the aperture (306) to the bottom of the aperture (307). If the top and bottom half of the exemplary embodiment are symmetric, this provides a more symmetric flow of gas in both directions. If there is a desire to optimize the direction of flow, optimizations to the difference in aperture diameter (306, 307), the thickness of the p-type thermoelectric materials (302, 304) and other properties can improve flow in the desired direction, such as when the nano gas pump is primarily used to pressurize or evacuate a working volume.

Figure 3C:
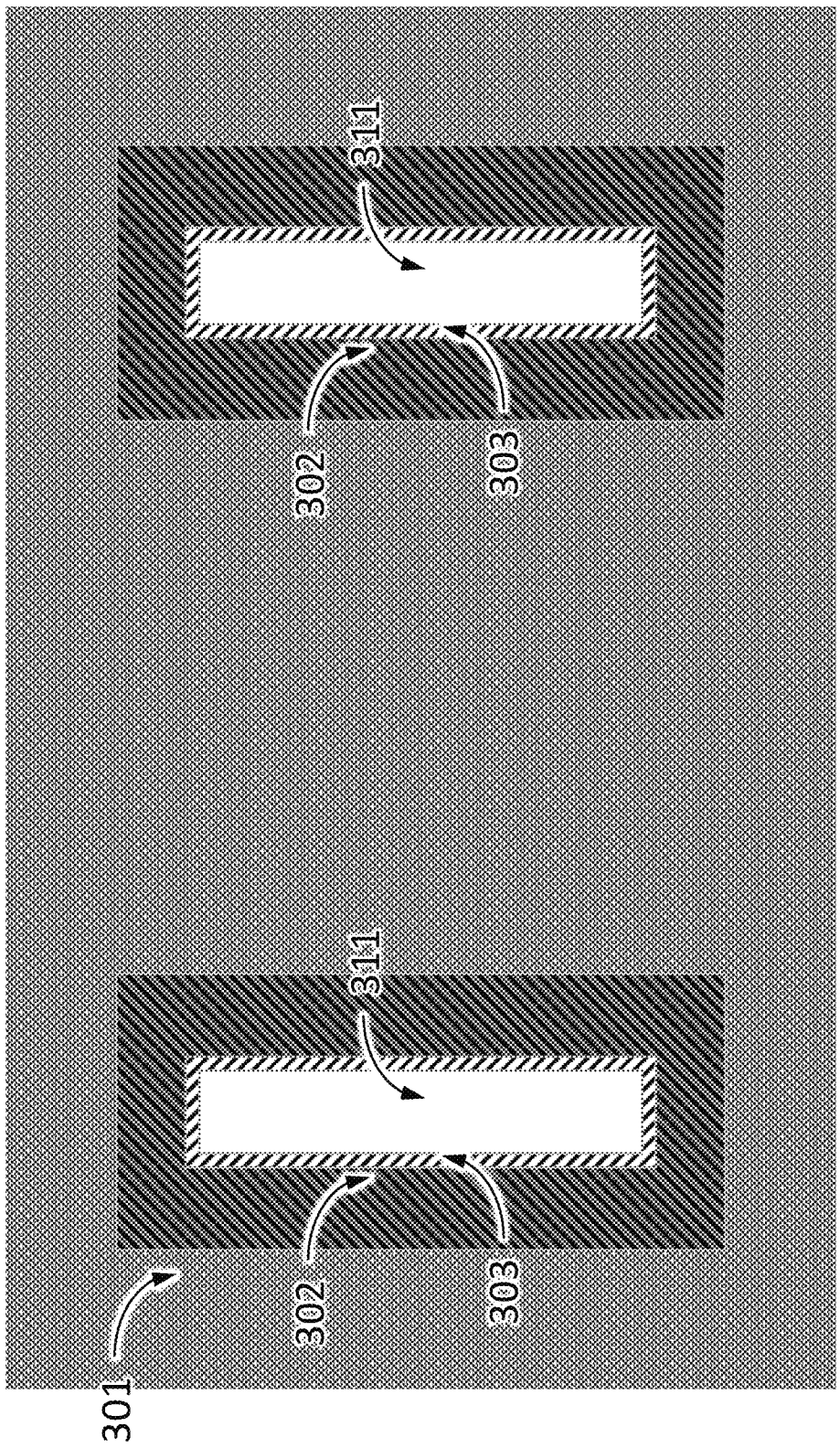
Figure 3D:
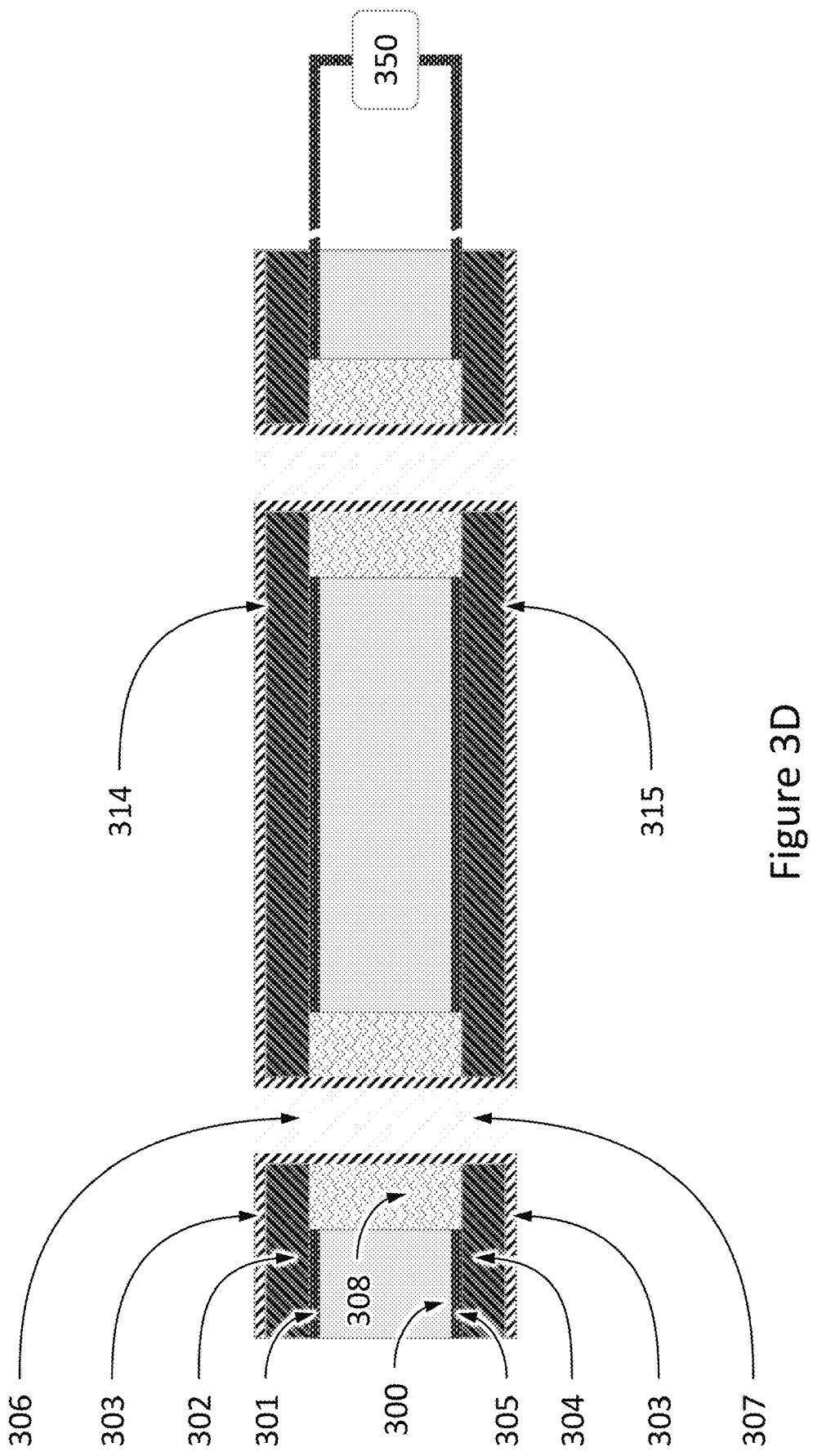

The exemplary embodiment of the proposed apparatus shown in FIG. 3A and FIG. 3B can be further configured with a rectangular aperture (311) as shown in FIG. 3C. Furthermore, the placement of the electrical interconnects (301) and (305), can deposited on the substrate (300) as shown in FIG. 3D. This allows for a much thinner n-type thermoelectric material (303) to be conformally deposited using chemical vapor deposition (CVD) or atomic layer deposition (ALD), with reduced post processing. While this may reduce performance, for certain designs it may be significantly simplify fabrication. In addition, proper doping adjustments of the p and n type thermoelectric materials can reduce the parasitical performance reductions. Furthermore, an electrically insulating interface (314) and (315) can be deposited on the p-type thermoelectric material (302) and (304) before etching the apertures (306) and depositing the n-type thermoelectric material (303).

Figure 3E:
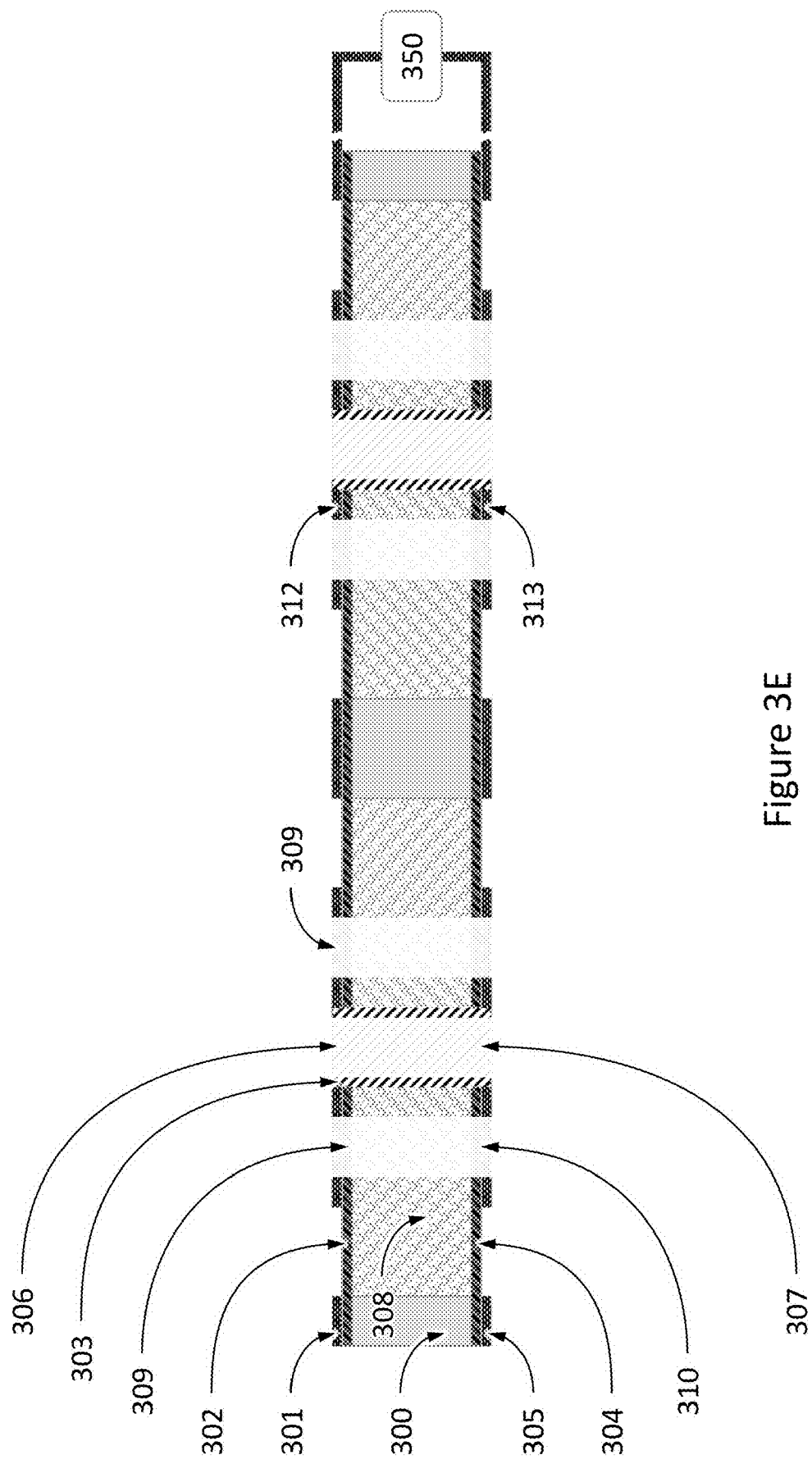
Figure 3F:
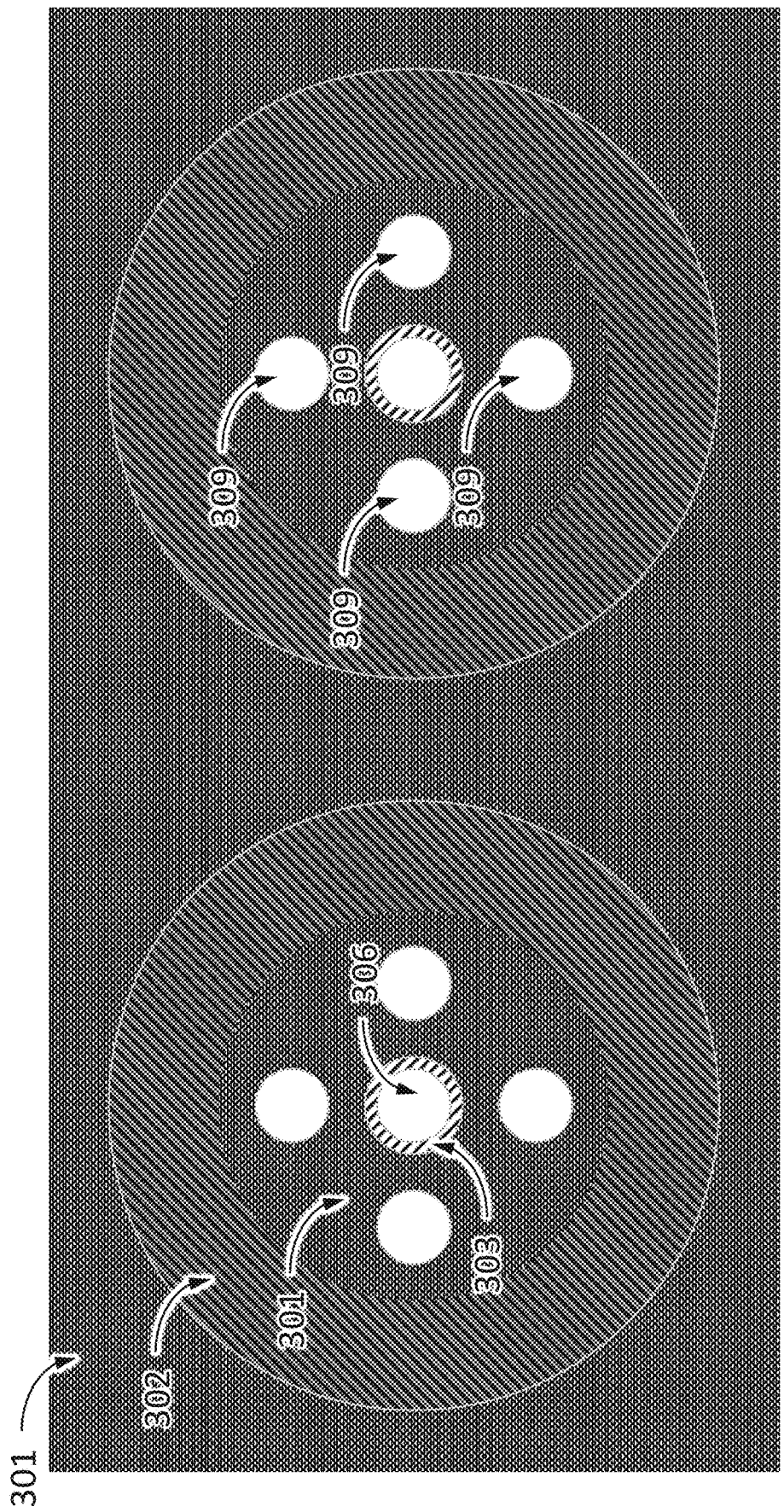

Furthermore, the optimal thickness of the sidewall of the n-type thermoelectric material (303) can be increased by increasing the work done to the gas using secondary apertures (309) as shown in FIG. 3E and FIG. 3F. To maintain a temperature difference between the top of the secondary aperture (309), and the bottom of the secondary aperture (310), similar to the temperature difference between the top of the primary aperture (306) and the bottom of the primary aperture (307), another metal interconnect (312) and (313) may be placed on the p-type thermoelectric material. This serves a similar purpose to the second interconnect (202) in FIG. 2A and FIG. 2B.

Figure 3G:
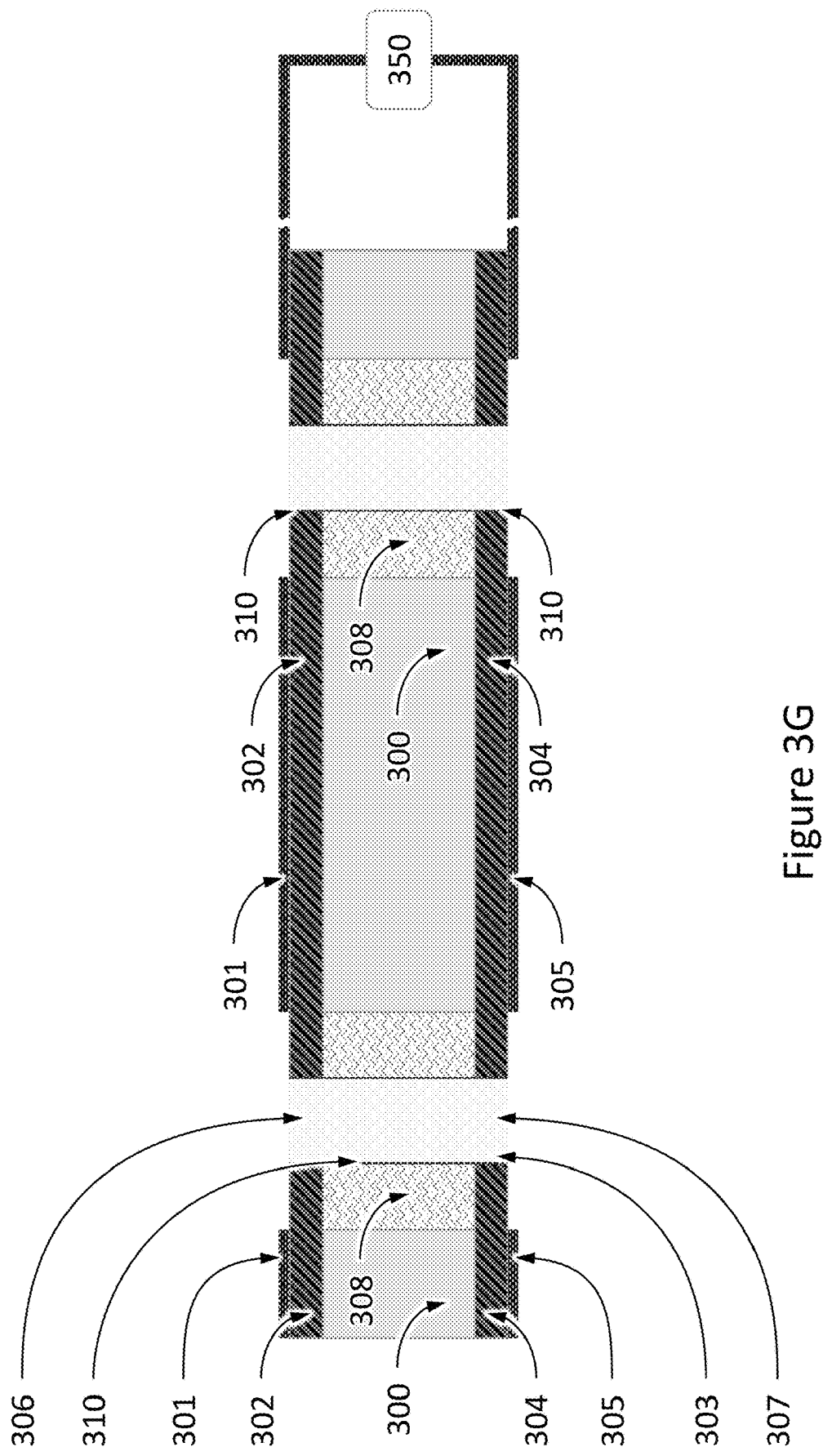

Furthermore, the n-type thermoelectric material (303) that makes up the sidewall of the primary aperture, can be replaced with a thin metal interconnect (310) as shown in FIG. 3G. This may be advantageous when the complementary thermoelectric material is not ready, has incurable drawbacks or cannot be deposited at the required sidewall thicknesses. Incurable drawbacks may include process incompatibilities, such as further temperature excursions, process gases, structural considerations, unfavorable crystallization, and other drawbacks. This method further enables the use of a PVD process for the first (302) and second (304) thermoelectric layer, and an ALD metal layer such as platinum, where a complementary CVD thermoelectric layer is not available.

The order of interconnect, p-type, n-type, p-type, interconnect in the exemplary embodiments, are for continuity purposes only. There are many different configurations including:

Interconnect, P-type, N-type, P-type, Interconnect
Interconnect, P-type, metal, N-type, metal, P-type, Interconnect
Interconnect, N-type, P-type, N-type, Interconnect
Interconnect, N-type, metal, P-type, metal, N-type, Interconnect
Interconnect, N-type, metal, N-type, Interconnect
Interconnect, P-type, metal, P-type, Interconnect
Interconnect, P-type, N-type, metal, Interconnect
Interconnect, N-type, P-type, metal, Interconnect
Interconnect, metal, P-type, metal, Interconnect
Interconnect, metal, N-type, metal, Interconnect This is not an exhaustive list and other configurations are possible to create apertures with large temperature gradients in the direction of the flow, with both ends of primary temperature gradient, in thermal communication with the substrate, either through a thermoelectric material with an opposing temperature gradient or through a metal interconnect.

Exemplary Configurations: Straight-Flow and Turn Flow

Figure 4A:
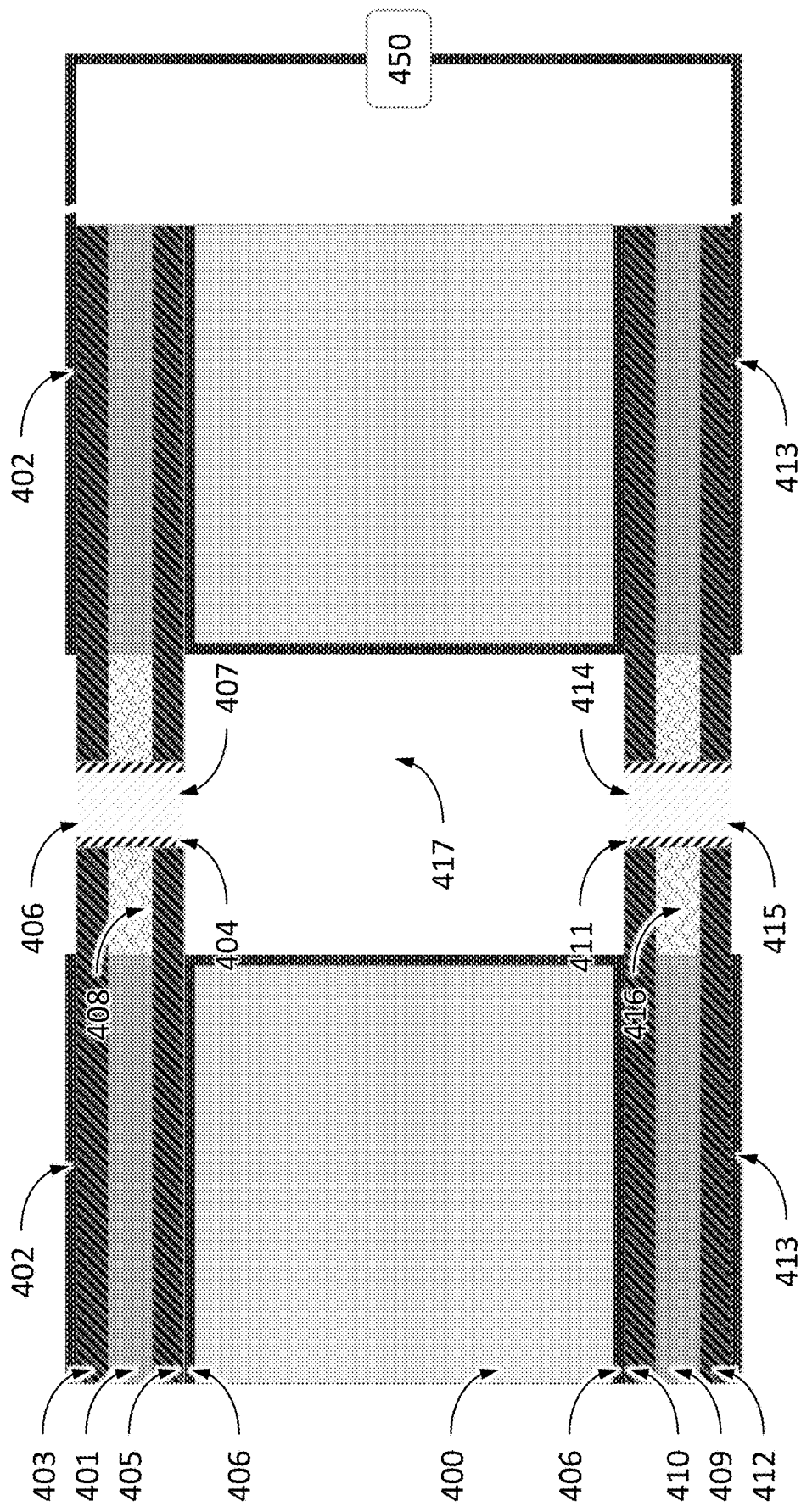
FIG. 4A describes an axisymmetric cross section of a linear multistage elementary apparatus introduced in FIG. 3A.

Furthermore, the exemplary embodiments disclosed in FIG. 3A and FIG. 3B can be further configured in series for straight flow of gas as shown by means of an exemplary embodiment in FIG. 4A. An electrical interconnect layer (402) is configured above the first p-type thermoelectric material (403). An electrically insulative and thermally conductive layer (401) is configured to be below the first p-type thermoelectric material (403) and above the second p-type thermoelectric layer (405). An n-type thermoelectric material (404) connects the first p-type thermoelectric material (403) and second p-type thermoelectric material (405). A less thermally conductive area (408) may be configured under the active thermoelectric layers (403, 404, 405) to reduce parasitic heat flux and maximize the temperature gradient between the top (406) and the bottom (407) opening of the aperture formed by the n-type thermoelectric material (404). A second electrical interconnect (406) then connects the second p-type thermoelectric material (405) with the third thermoelectric material (410). A thicker thermally conductive layer (400) separates the first nano gas pump (402-408) from the second nano gas pump (410-416). This thermally conductive layer (400) may also be electrically conductive in straight flow configurations. A second electrically insulative and thermally conductive layer (409) is configured below the third p-type thermoelectric material (410) and above the fourth p-type thermoelectric material (412). A less thermally conductive area (416) may be configured under the active thermoelectric heat pump (410, 411, 412) to reduce parasitic heat flux and maximize the temperature gradient between the top (414) and the bottom (415) opening of the aperture formed by the n-type thermoelectric material (411). A power supply completes the circuit between the first electrical interconnect (402) and the third electrical interconnect (413). Applying a positive voltage to the first interconnect (402), will create conditions for thermal diffusion of the gas, causing it to flow from the first bottom aperture (407) to the first top aperture (406) and causing it to flow from second bottom aperture (415) to the second top aperture (414) and into the volume (417) separating the two nano gas pumps. If the flow above the first top aperture (406) is restricted or terminated, then the pressure in the volume separating the two nano gas pumps (417) will increase above the pressure of the volume below the second bottom aperture (415).

Figure 4B:
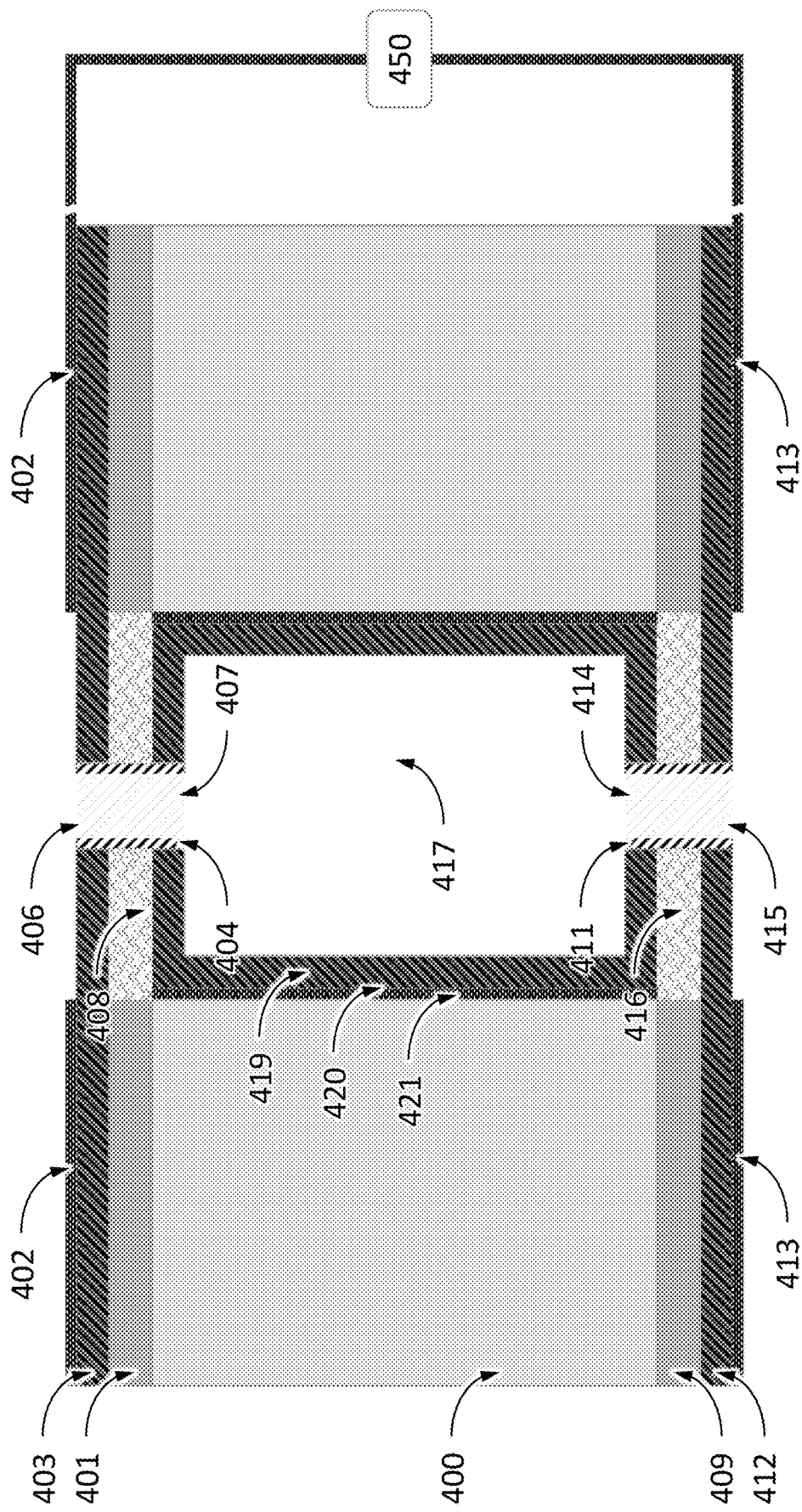
FIG. 4B describes manufacturing and performance optimizations to the elementary apparatus introduced in FIG. 4A.

The exemplary embodiment in FIG. 4A can be further configured to where the second and third p-type thermoelectric material are connected (419) as shown if FIG. 4B. A second interconnect (421) is configured on the second and third p-type thermoelectric material (419) in the area where temperature differences are not desired. Since current flows through the least electrically resistive path, most of the current will flow through the interface (420) between the middle p-type thermoelectric material (419) and the second interconnect (421). This exemplary embodiment serves to demonstrate that parts of the thermoelectric material can be bypassed by placing more electrically conductive materials on them. Not only can this simplify the fabrication of such devices, but it also serves to reduce the contact resistance between the thermoelectric material and the electrical interconnects.

Figure 5A:
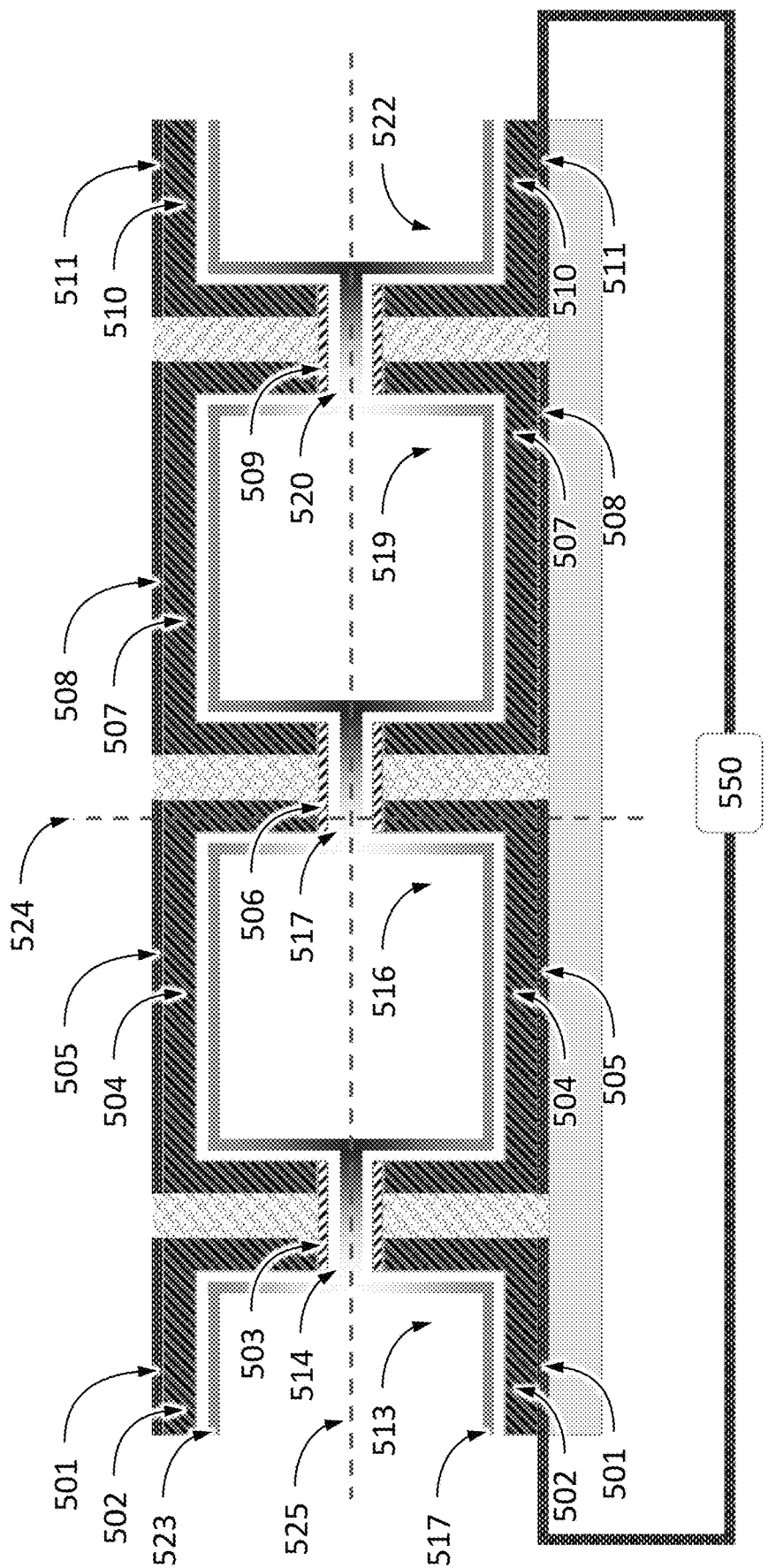
FIG. 5A describes a cross sectional view in line with the flow axis, FIG. 5B describes a cross sectional view perpendicular to the flow axis, and FIG. 5C describes a top-down cross-sectional view of an arrangement of elementary parts arranged in series in an exemplary apparatus for producing a straight flow using a complementary arrangement of thermoelectric elements.
Figure 5B:
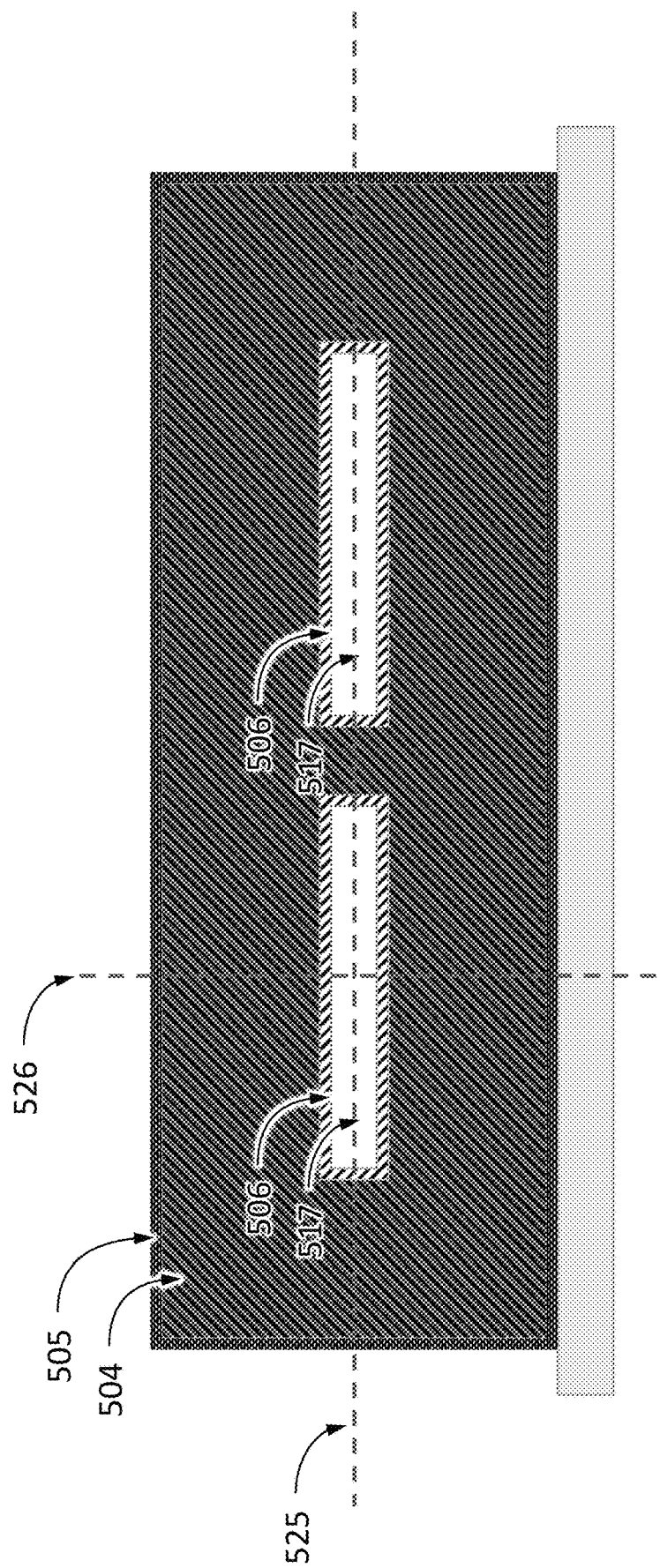
FIG. 5D describes a cross sectional view in line with the flow axis of an exemplary apparatus first introduced in FIG. 5A, further optimized for fabrication by means of an insulating top lid.
FIG. 5E describes a cross sectional view in line with the flow axis of an exemplary apparatus first introduced in FIG. 5A, further optimized for fabrication by means of a flatter lop lid using complementary arrangement of thermoelectric elements.
Figure 5C:
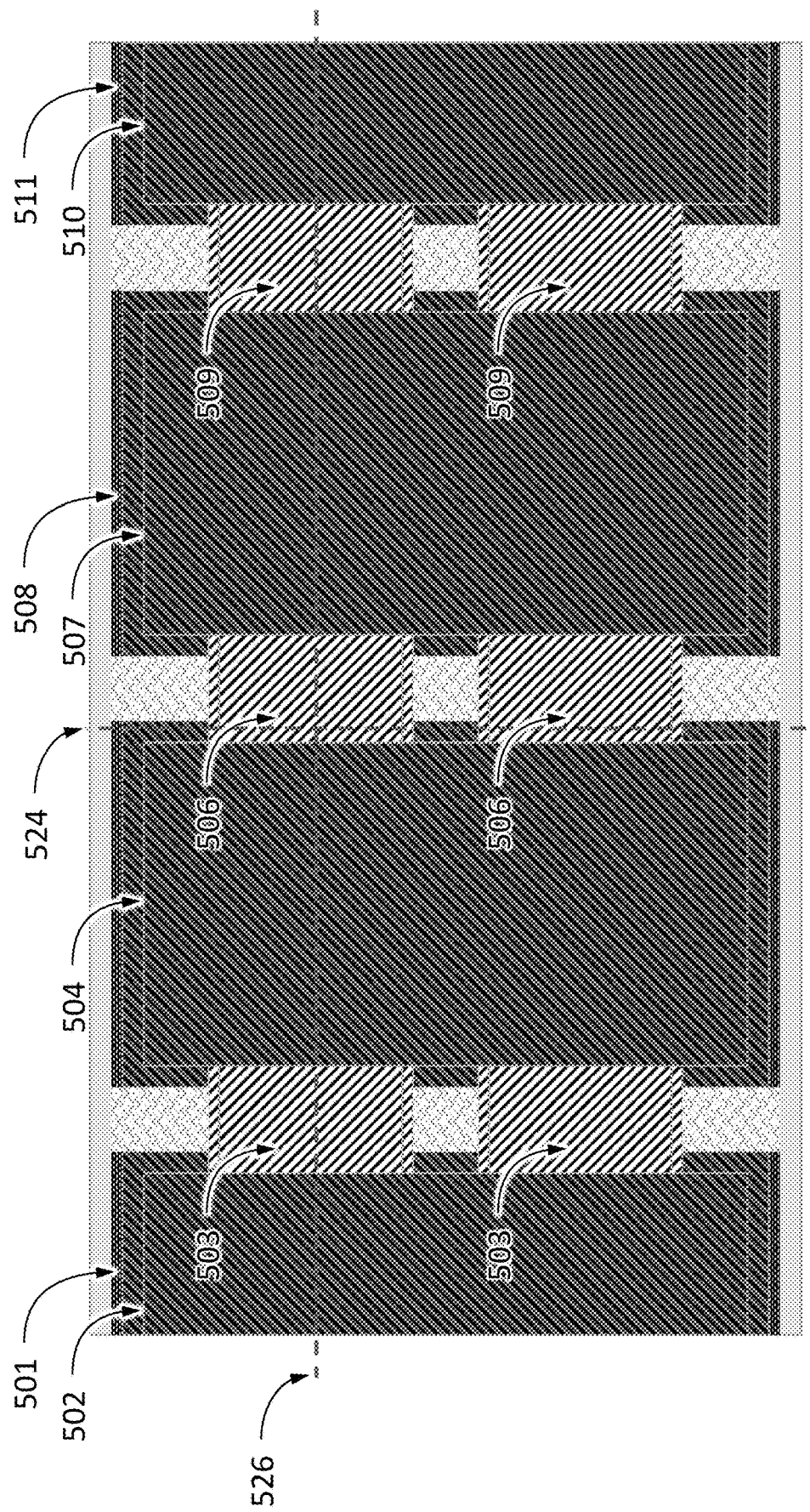

Another exemplary embodiment of a straight flow is described in FIG. 5A, FIG. 5B and FIG. 5C. Cross section (526) is represented in FIG. 5A, cross section (524) is represented in FIG. 5B, and cross section (525) is represented in FIG. 5C. The first interconnect (501) is connected to the first p-type thermoelectric segment (502), then to the first n-type thermoelectric segment (503), then to the second p-type thermoelectric segment (504), then to the second electrical interconnect (505), then back to the second p-type thermoelectric segment (504), then to the second n-type thermoelectric segment (506), then to the third p-type thermoelectric segment (507), then to the third electrical interconnect (508), then back to the third p-type thermoelectric segment (507), then to the third n-type thermoelectric segment (509), then to the fourth p-type thermoelectric segment (510), then to the fourth electrical interconnect (511), then completing the circuit with the first electrical interconnect (501) through the power supply (550). When the appropriate positive voltage is applied to the first electrical interconnect (501), a temperature gradient is established on the surface of the thermoelectric segment (523) where the lighter color is hotter, and the darker color is cooler. This creates a flow of gas from the fourth volume (522) through the third aperture (520), into the second volume (519), then through the second aperture (517) into the second volume (516), then through the first aperture (514) into the first volume (513). If the flow out of the first volume (513) or the fourth volume (522) is restricted, then the pressure will be highest in the first volume (513) and lowest in the fourth volume (522). If a negative voltage is applied to the first electrical interconnect (501), then the flow of gas and resultant pressure differences will reverse.

Figure 5D:
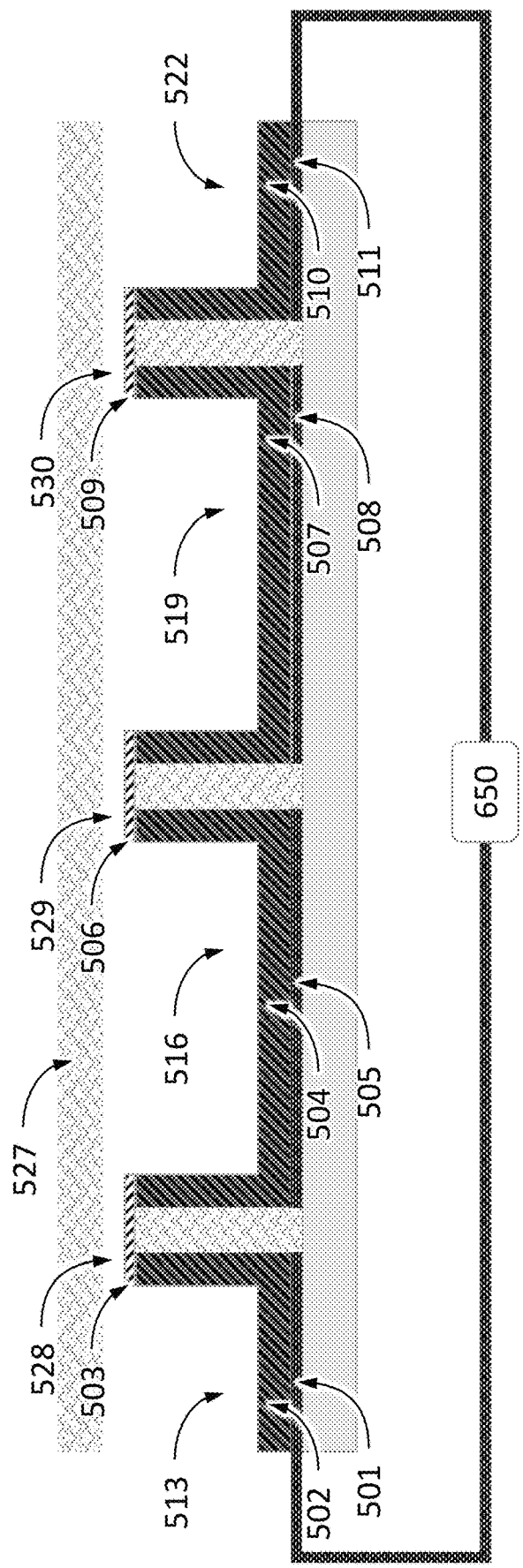

Furthermore, to simplify the fabrication of a straight flow embodiment of the nano gas pump apparatus, the upper half of the pump can be replaced with an electrically and thermally insulative material (527) as shown in FIG. 5D, and may require reducing the aperture height (528, 529, 530), to reduce the losses from reduced flow velocities. While this embodiment reduces efficiency and performance, it also reduces the fabrication complexity of the nano gas pump.

Figure 5E:
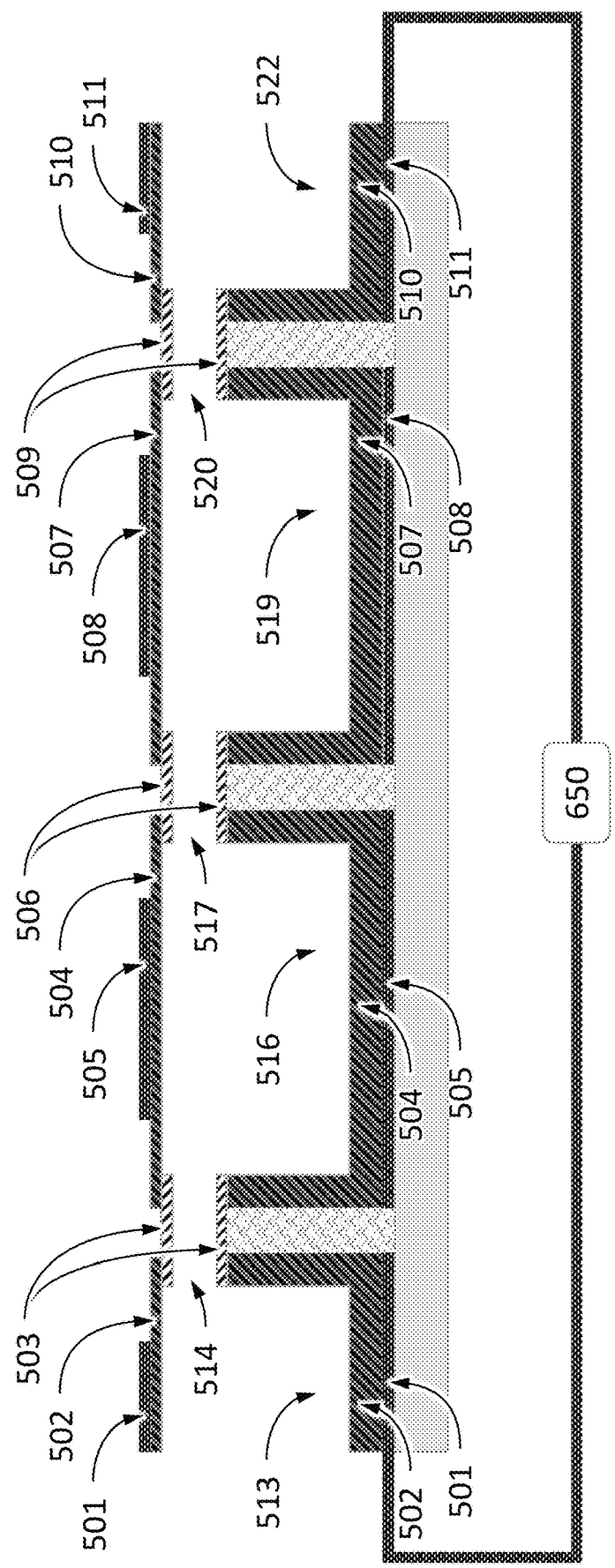

Moreover, instead of removing the top part of the nano gas pump, the top can be made flatter and therefore reduce process complexity without sacrificing as much performance and efficiency by configuring the top interconnects (501, 505, 508, 511), p-type thermoelectric segments (502, 504, 507, 510) and n-type thermoelectric segments (503, 506, 509) as shown in FIG. 5E. While electrical interfaces between electrical interconnects and thermoelectric segments and electrical interfaces between thermoelectric segments are shown with significant overlap, the overlap may be limited by the desired contract resistance and the available fabrication capabilities.

Figure 6A:
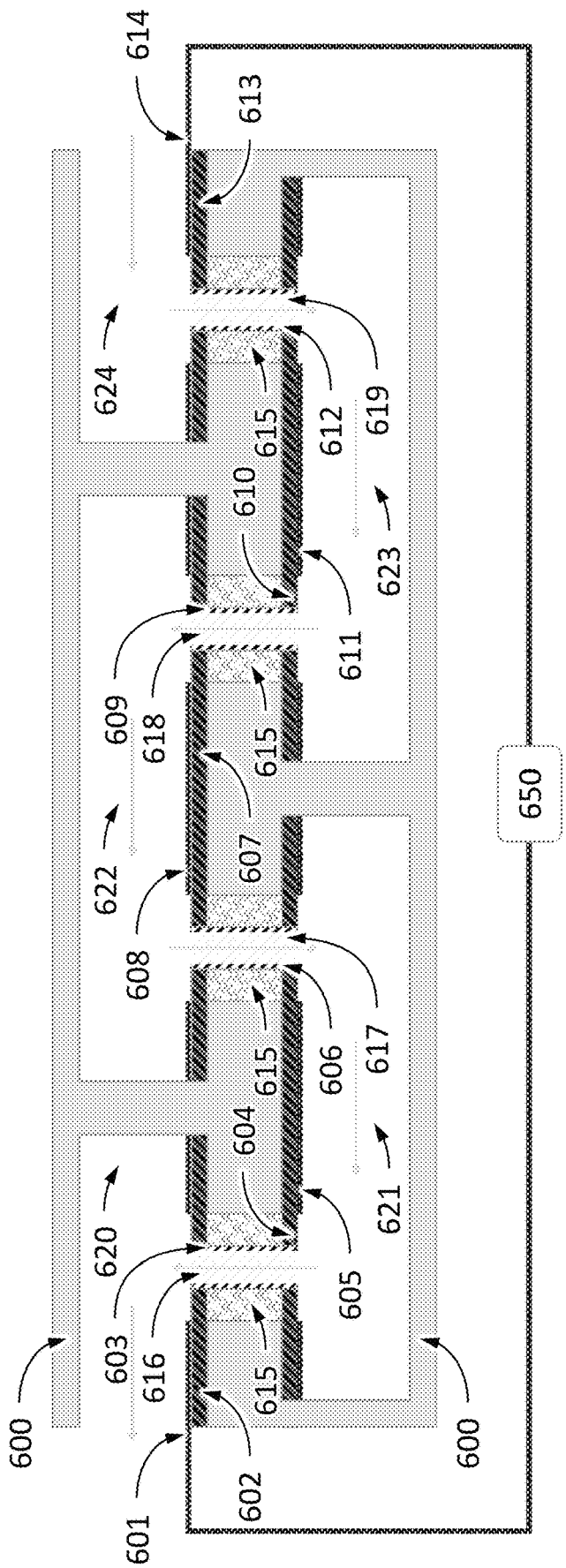
FIG. 6A describes a cross sectional view along the flow axis of an arrangement of elementary parts first introduced in FIG. 3E and arranged in series in an exemplary apparatus for producing a turn flow using a complementary arrangement of thermoelectric elements.

The example of an embodiment disclosed in FIG. 3A and FIG. 3B can be further configured in series for turn flow of gas by means of another exemplary embodiment shown in FIG. 6A. Here the first electrical interconnect (601) is layered on top of the first p-type thermoelectric (603), which is connected to the first n-type thermoelectric (603), then to the second p-type thermoelectric (604), then to the second electrical interconnect (605), then back to the second p-type thermoelectric (604), then to the second n-type thermoelectric (606), then to the third p-type thermoelectric (607), then to the third electrical interconnect (608), then back to the third p-type thermoelectric (607), then to the third n-type thermoelectric (609), then to the fourth p-type thermoelectric (610), then to the fourth electrical interconnect (611), then back to the fourth p-type thermoelectric (610), then to the fourth n-type thermoelectric (612), then to the fifth p-type thermoelectric (613), then to the fifth electrical interconnect (614), then completing the circuit with the first electrical interconnect (601) through the power supply (650). When a positive voltage is applied to the first electrical interconnect (601), an alternating temperature gradient is established between sequential nanopumps. This creates a flow from the fifth volume (624), through the aperture (619) of the fourth nanopump (610-614), into the fourth volume (623), then through the aperture (618) of the third nanopump (607-611) into the third volume (622), then through the aperture (617) of the second nanopump (604-608) into the second volume (621), through the aperture (616) of the first nanopump (601-605) into the first volume (620). The nanopumps may include an insulator (615) in the area with active thermal gradients to improve efficiency. A thermally conductive and electrically insulating material (600) encloses each interior volume (620-624) while providing an inlet and an outlet and is connected by the apertures (616-619) of the nano gas pumps. The required amount of thermal conductivity of material is dependent on the application and required performance. An electrically conductive material may also be used if properly insulated from the electrical interconnects and thermoelectric segments (601-614). This material may also be made of multiple materials, and in some embodiments be made of low thermal conductivity materials when the operating power is low enough or other methods to remove excess heat are sufficient. In the fabrication of the nano gas pump, for those skilled in the art of semiconductor manufacturing, can appreciate that the first (601), third (608) and fifth (614) electrical interconnect can be made through the deposition of a single stack of electrically conductive material and patterning it to properly isolate the electrical connections. The same for the first (602), third (607) and fifth (613) p-type thermoelectric segments, and for the second (604) and fourth (610) p-type thermoelectric segments, and the second (605) and fourth (611) electrically conductive material.

Figure 6B:
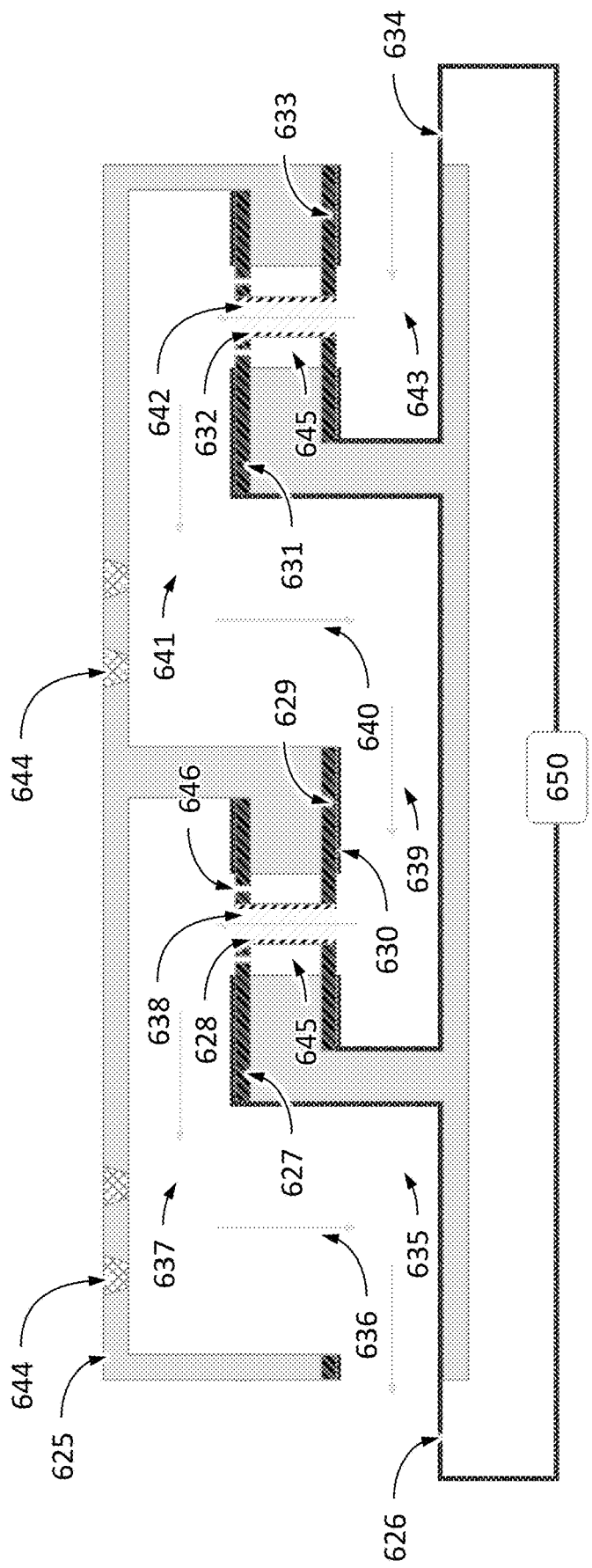
FIG. 6B describes a cross-sectional view along the flow axis of an exemplary apparatus first introduced in FIG. 6A, further optimized for fabrication by means of connecting the top volume and bottom volume to optimize the removal of sacrificial material during the fabrication process.

Generally, fabrication methods require the deposition of a sacrificial material that is then removed with a highly selective etch process. Examples include polysilicon (poly-Si) deposition removed with xenon difluoride ($XeF_2$), and silicon dioxide ($SiO_2$) deposition removed with hydrogen fluoride (HF). Even when using vapor phase gases, sufficient access is desired to reduce process time and minimize undesired etching of non-sacrificial materials. The exemplary apparatus in FIG. 6A can be further configured as shown in FIG. 6B to include access holes (644) into the main channels (635-643). If the insulating material (645) of the nano gas pumps (626-630, 630-634), is made of a sacrificial material, in addition to the method disclosed in FIG. 3E and FIG. 3F, the first thermoelectric segment (627), the second segment (628), or the third thermoelectric segment (629) can be configured with access holes (646) for etchants to access the sacrificial material (645). The access holes (646) in the nano gas pumps may be made on only one layer of the nano gas pump to prevent the pressurized gas from leaking back into the adjacent volume. This is because access holes (646) in the first thermoelectric material (627, 631) and third thermoelectric material (629, 633) will have a lower temperature gradient than the temperature gradient along the second material (628, 632). Access holes (646) immediately adjacent to the second material (628, 632) will leak less pressurized gas as the temperature gradient is higher, however this is limited by fabrication complexity and increased electrical resistance.

For the etchants to access the lower volumes (635, 639, 643) it may be advantageous to remove a nano gas pump stage, to facilitate access to the lower volumes, as shown in FIG. 6B. Other methods include, sufficient nano gas pump aperture (638, 642) area, side access ports, integration of volumes directly to the membrane containing the nano gas pumps and other methods. In the exemplary embodiment shown in FIG. 6B, the first electrical interconnect (626) is connected to the first p-type thermoelectric segment (627), which is connected to the first n-type thermoelectric segment (628), then to the second p-type thermoelectric segment (629), then to the second electrical interconnect (630), then to the third p-type thermoelectric segment (631), then to the second n-type thermoelectric segment (632), then to the fourth p-type thermoelectric segment (633), then to the third electrical interconnect (634), then completing the circuit with the first interconnect (626) through the power supply (650). When a positive voltage is applied to the first electrical interconnect (626), a temperature gradient in the same direction is established between sequential nano gas pumps. This creates a flow of gas from the seventh volume (643), through the aperture (642) of the second nano gas pump (630-634), into the sixth volume (641), then into the fifth volume (640) created by the exclusion of a nano gas pump and connecting the fourth volume (639), then through the aperture (638) of the first nano gas pump (626-630), into the third volume (637), then into second volume (636) created by the exclusion of a nano gas pump and connecting the first volume (635). The material (625) that encapsulates the interior volumes (635-643) separating the nano gas pumps (626-634), is initially a sacrificial material, which is then removed through the access holes (644). The access holes are then sealed with another process such as physical vapor deposition (PVD) of silicon oxide ($SiO_2$), tungsten (W) or other material, and or process. Atomic layer deposition (ALD) of an oxide or other electrically insulative material can be further employed to seal the access holes (644) and protect the surface of the nano gas pumps (626-634).

Exemplary Configurations: Staging

Figure 7A:
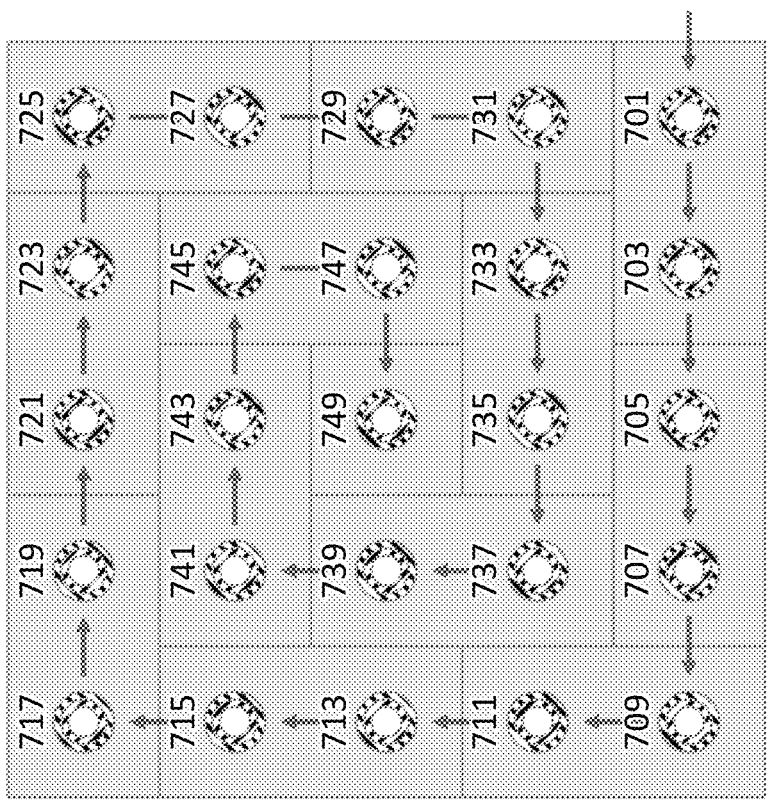
FIG. 7A describes the path the flow of gas takes through the exemplary apparatus introduced in FIG. 7B and FIG. 7C. This exemplary apparatus introduces method to minimize the footprint of a long chain of gas nano pumps.
Figure 7B:
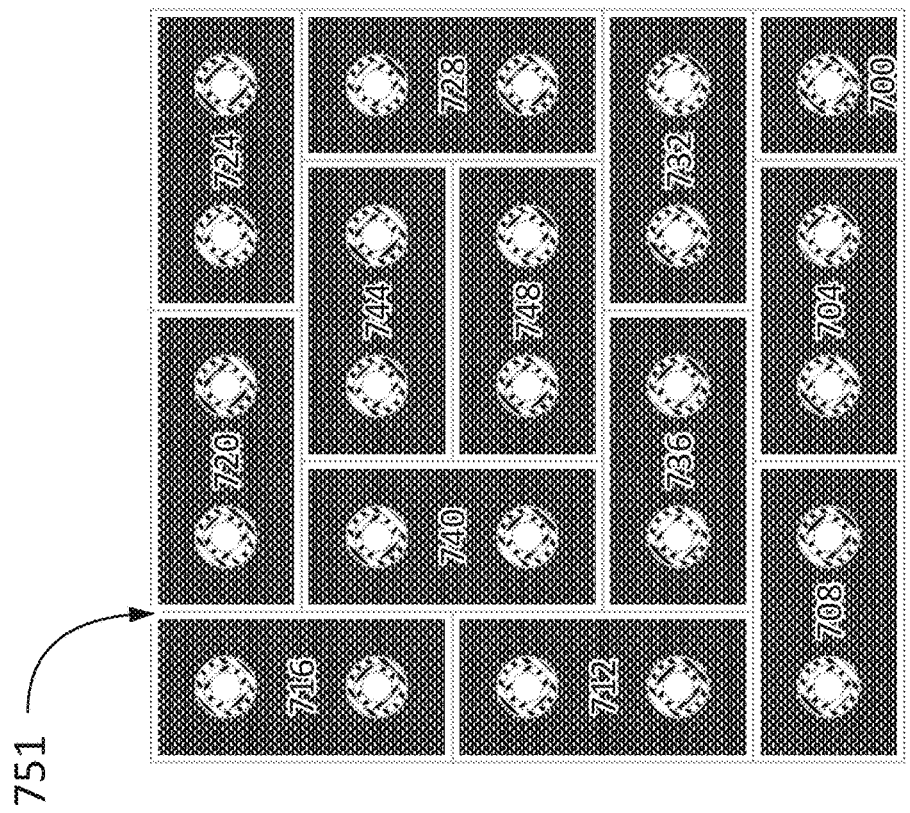
FIG. 7B describes a bottom-up cross-sectional view of an arrangement of elementary parts first introduced in FIG. 3B.
Figure 7C:
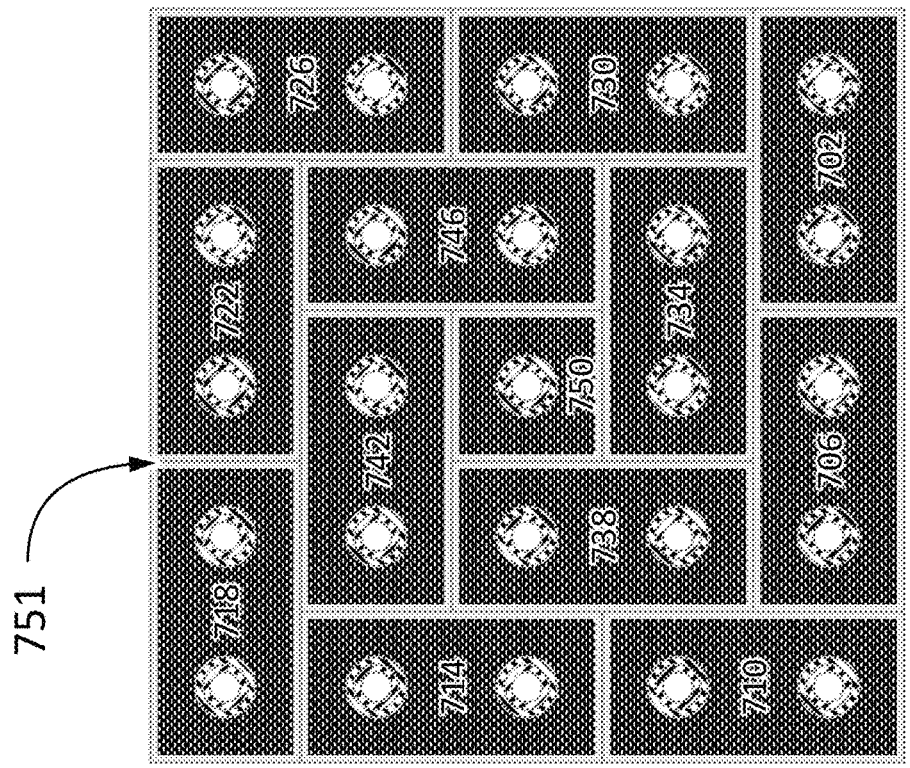
FIG. 7C describes a top-down cross-sectional view of an arrangement of elementary parts first introduced in FIG. 3B.

An exemplary arrangement of the exemplary apparatus previously shown in FIG. 3A and FIG. 3B is shown in FIG. 7A, FIG. 7B and FIG. 7C. FIG. 7A shows an exemplary flow path from the outside volume (700) to the center volume (750), FIG. 7B shows a cross sectional view from bottom to top, where the substrate (751) forms enclosed volumes as previously shown in FIG. 6A. FIG. 7C shows a cross sectional view from top to bottom, where the substrate (751) forms enclosed volumes as previously shown in FIG. 6A. The flow goes from an open outside volume (700), through the first nano gas pump (701), into a top volume (702), into second nano gas pump (703) and so on sequentially until it goes through the last nano gas pump (749) and into the open volume in the center (750). Generally, there will be multiple nano gas pumps per open volume, and a fault tolerant distribution of electrical interconnects terminated in a method and location favorable to connect the arrangement of nano gas pumps to a power supply.

Figure 7D:
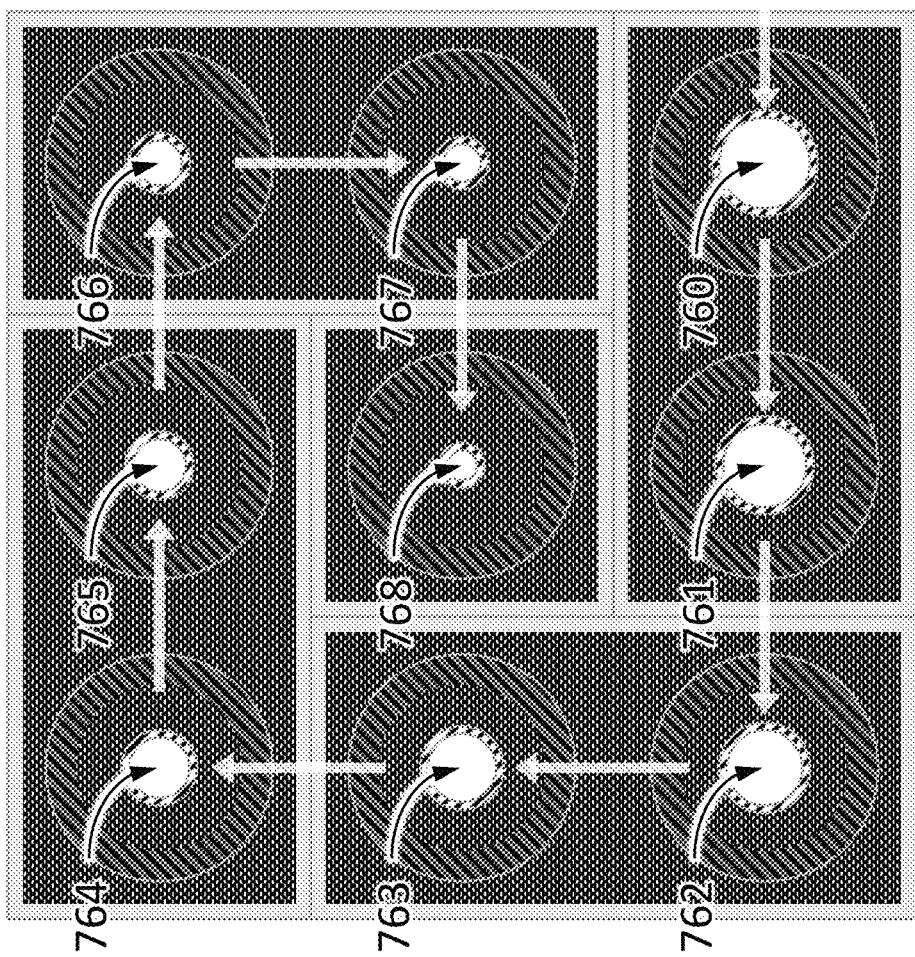
FIG. 7D describes a top-down cross-sectional view of an exemplary apparatus first introduced in FIG. 7C, further optimized for producing compressed air through the center nano gas pump.

Besides having an increasing or decreasing number of apertures and or aperture area per stage, the diameter of the apertures may also be changed to improve performance when the expected pressure gradient is known. The mean free path of the gas is largely dependent on the pressure of the gas, and therefore if the application is pressurizing the gas from the outside to the center of the nano gas pump arrangement as shown in FIG. 7D, then the diameters of the apertures of the nano gas pump may decrease sequentially (760-768) as determined by an optimization method, like the one further disclosed.

Figure 7E:
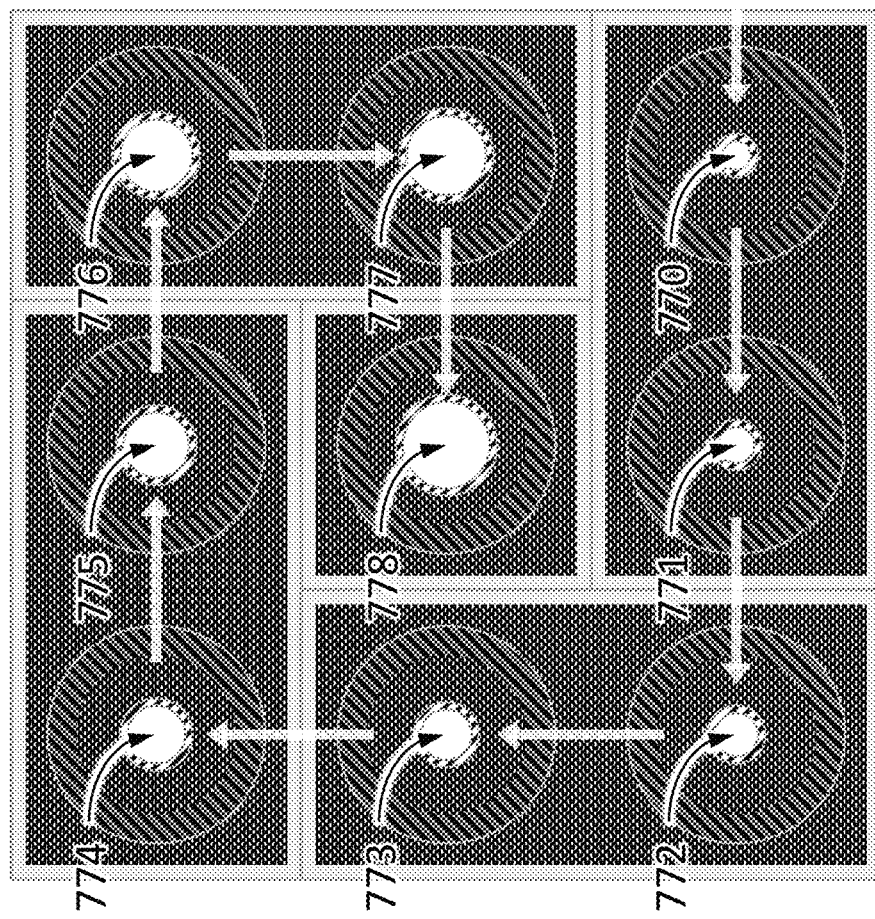
FIG. 7E describes a top-down cross-sectional view of an exemplary apparatus first introduced in FIG. 7C, further optimized for reducing pressure through the center nano gas pump.

When the application is evacuating gas out of the center of the arrangement of nano gas pumps as shown in FIG. 7E, then the diameters of the apertures of the nano gas pumps may be increased sequentially (770-778) as determined by an optimization method, like the one further disclosed.

Exemplary Application: Integrated Microfluidic Valves and Pumps

An arrangement of nano gas pumps may be used to compress gas, for purposes of actuating a pneumatic apparatus, mass flow control, environmental control, separating and stratifying lighter molecules or even for lifting and translating a micro drone.

An arrangement of nano gas pumps may be used to rarify gas, for the purposes of actuating a pneumatic apparatus, mass flow control, environmental control, separating and stratifying heavier molecules and even for creating a vacuum for analytical instruments such as a mass spectrometer.

Figure 8A:
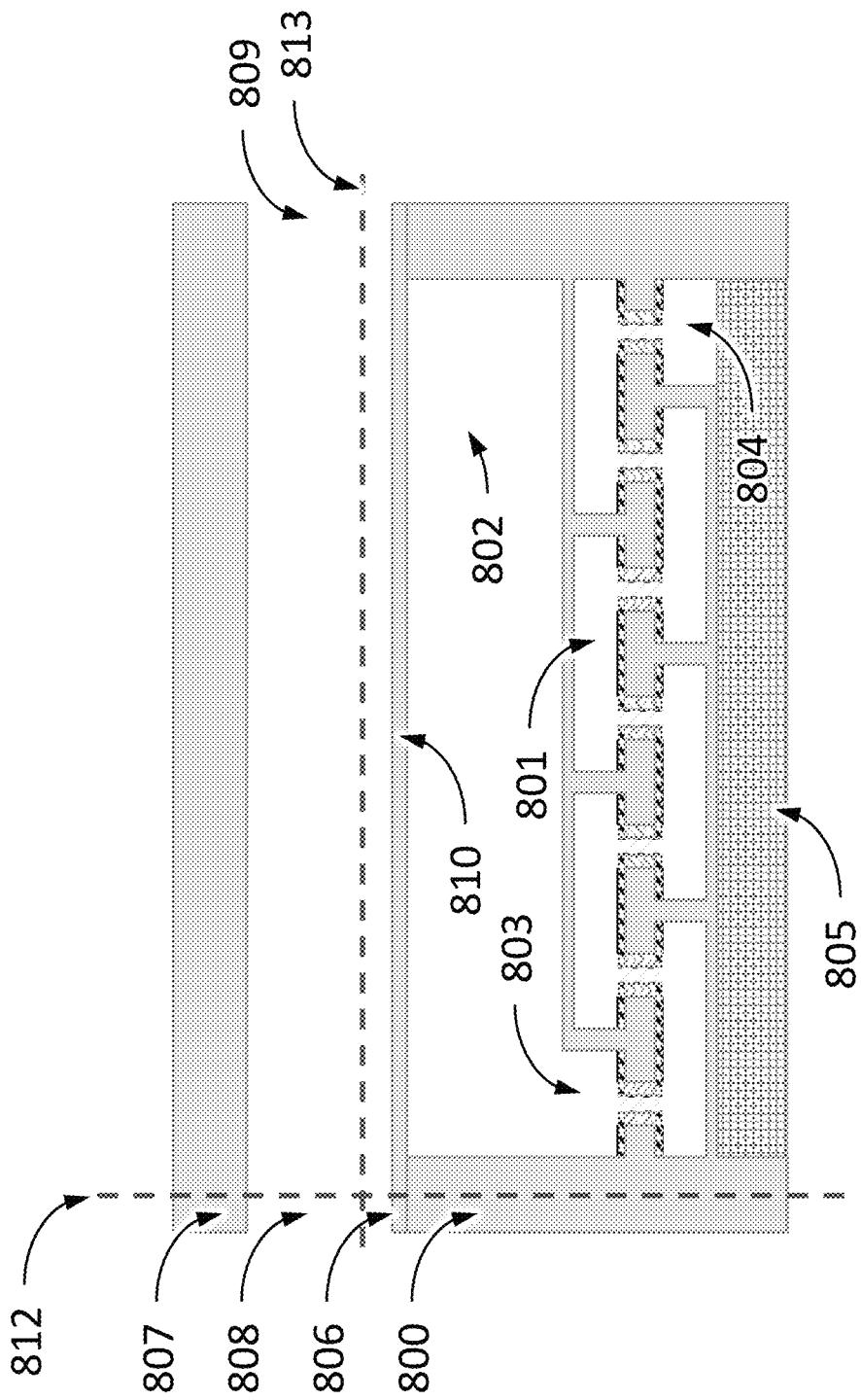
FIG. 8A describes a cross sectional view in of an exemplary apparatus first introduced in FIG. 6A, further integrated into a pneumatic valve in an exemplary apparatus to control the flow of a secondary fluid pneumatically without the aid of an external pneumatic system.
Figure 8B:
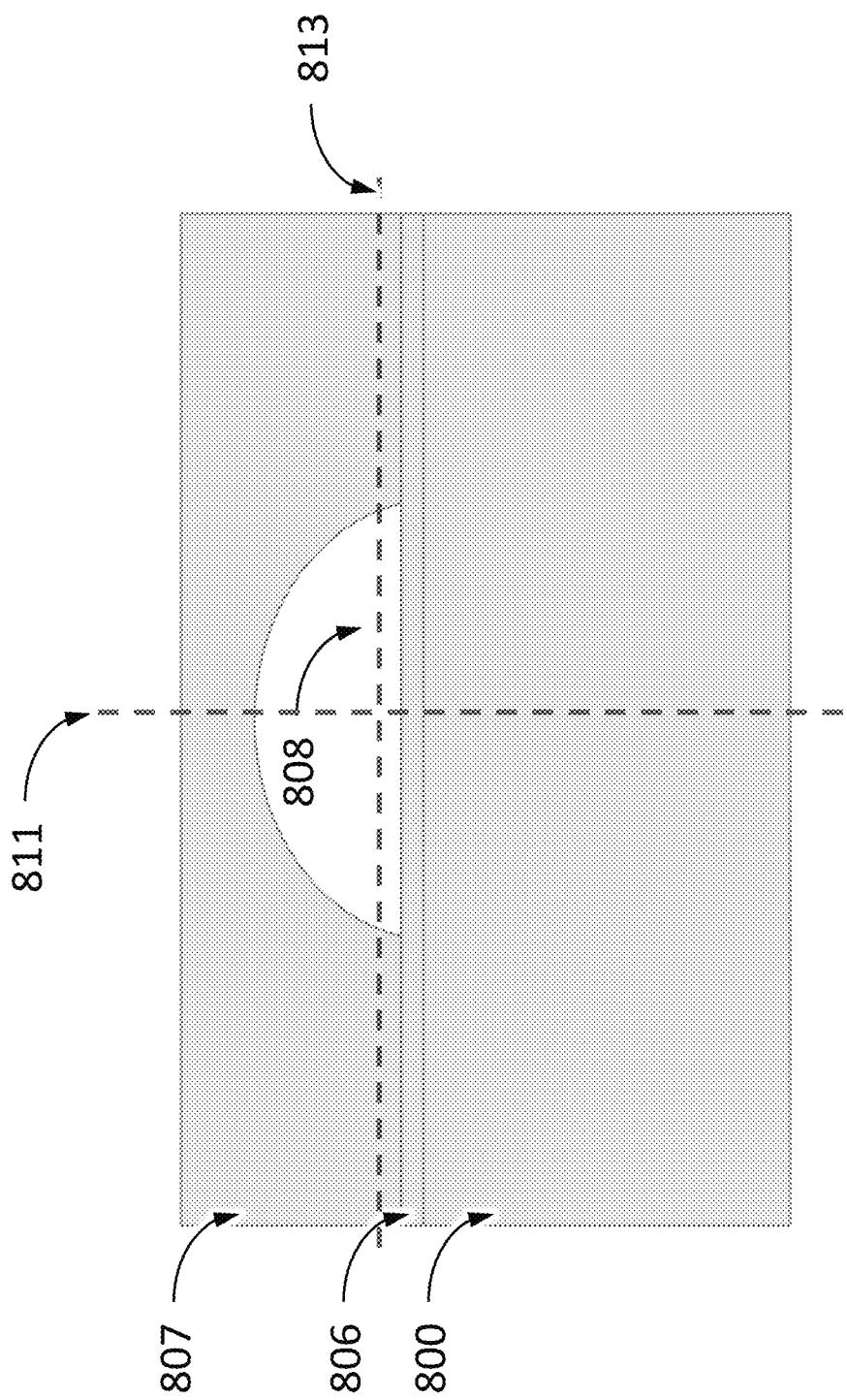
FIG. 8B describes a cross sectional view perpendicular to the flow axis of the secondary fluid of an exemplary apparatus first introduced in FIG. 8A.
Figure 8C:
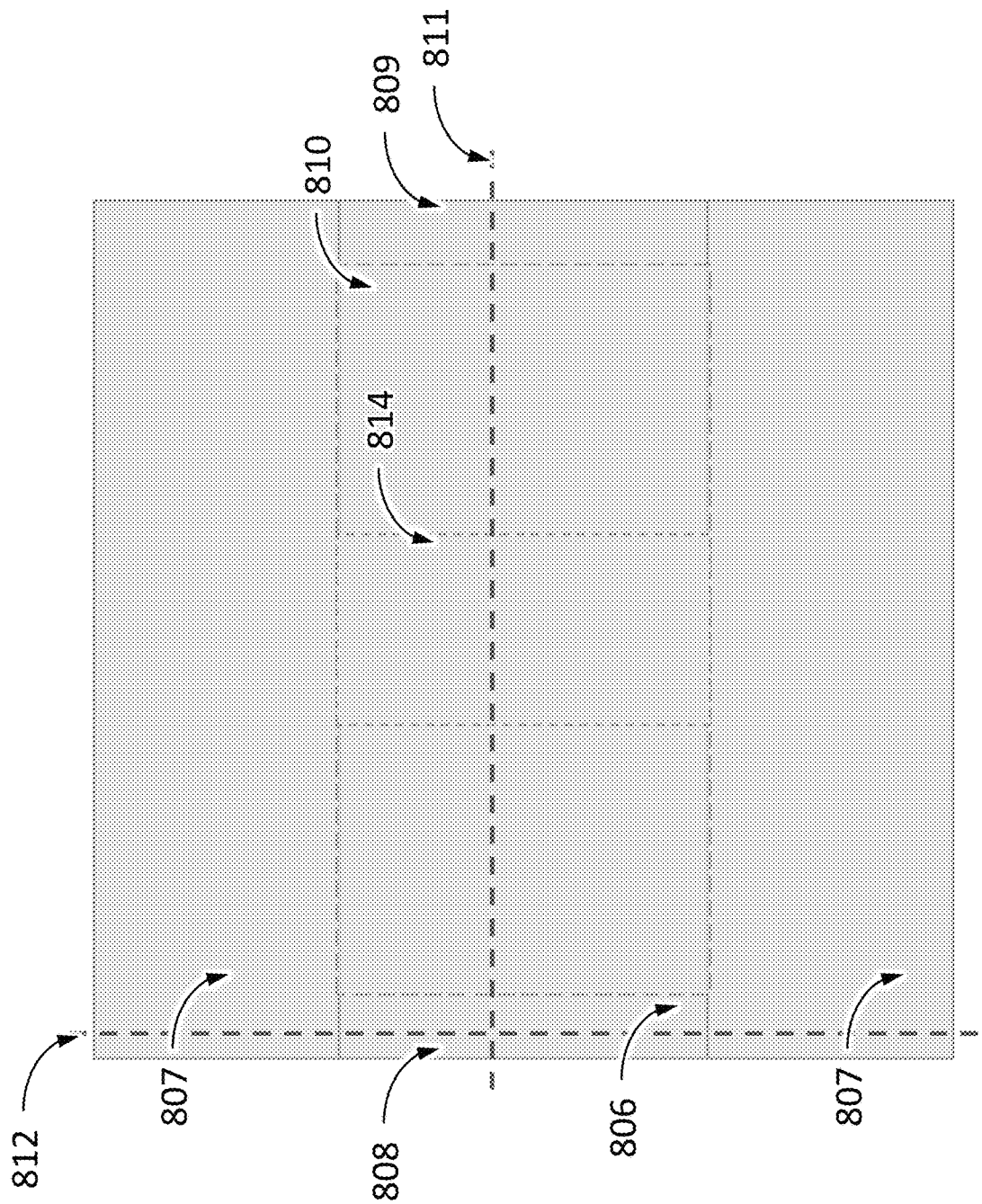
FIG. 8C describes a top-down cross-sectional view in line with the flow axis of the secondary fluid of an exemplary apparatus first introduced in FIG. 8C.

An exemplary application for an integrated pneumatic valve is shown in FIG. 8A, FIG. 8B and FIG. 8C. Where (800) is a bottom substrate housing an arrangement of nano gas pumps (801) and a control volume (802) for pneumatically actuating a membrane (806, 810), a gas filter capable of filtering out particles smaller than the aperture diameter (805) protects one end of the arrangement of nano gas pumps (801) and the other end of the arrangement of nano gas pumps is open to and enclosed control volume (802).

Figure 8D:
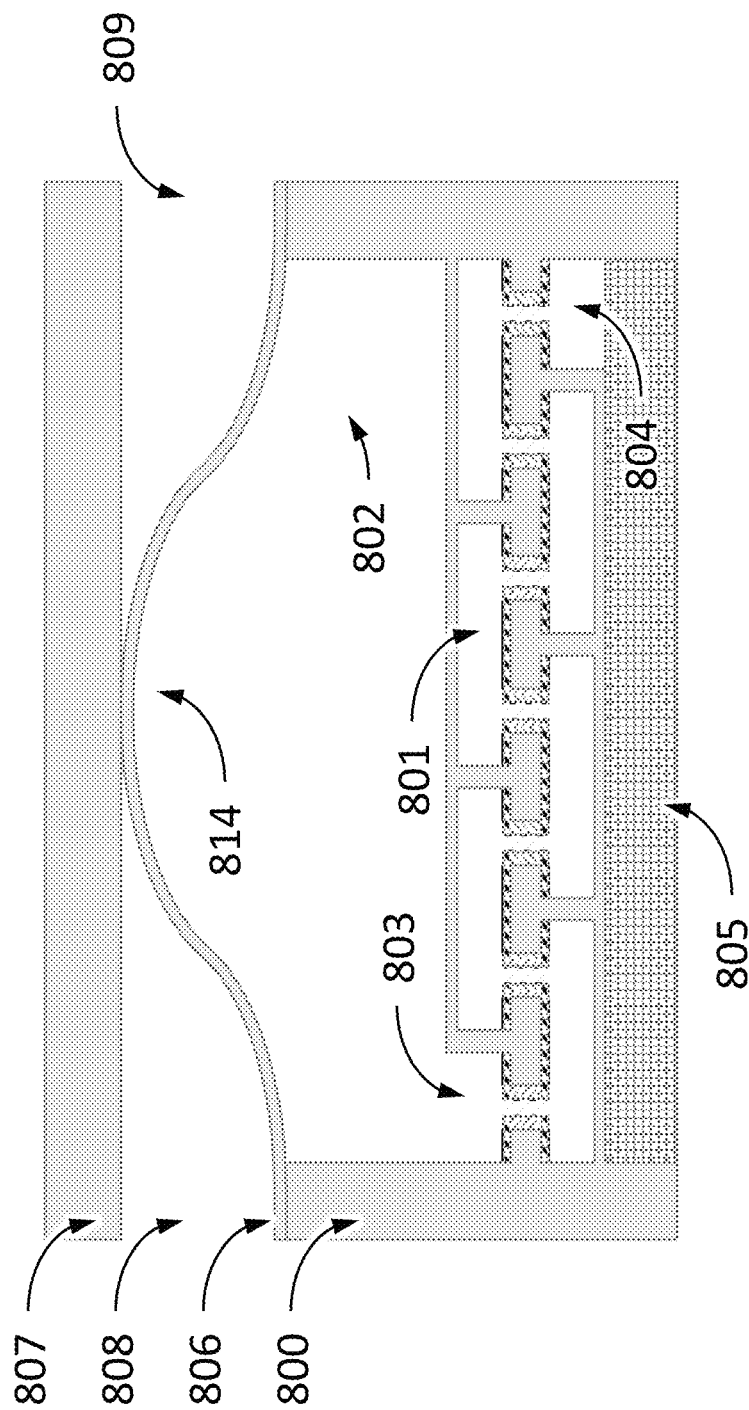
FIG. 8D describes a cross sectional view of an exemplary apparatus first introduced in FIG. 8A, wherein the nano gas pump has pressurized the pneumatic chamber causing the flow of the secondary fluid to be restricted.
Figure 8E:
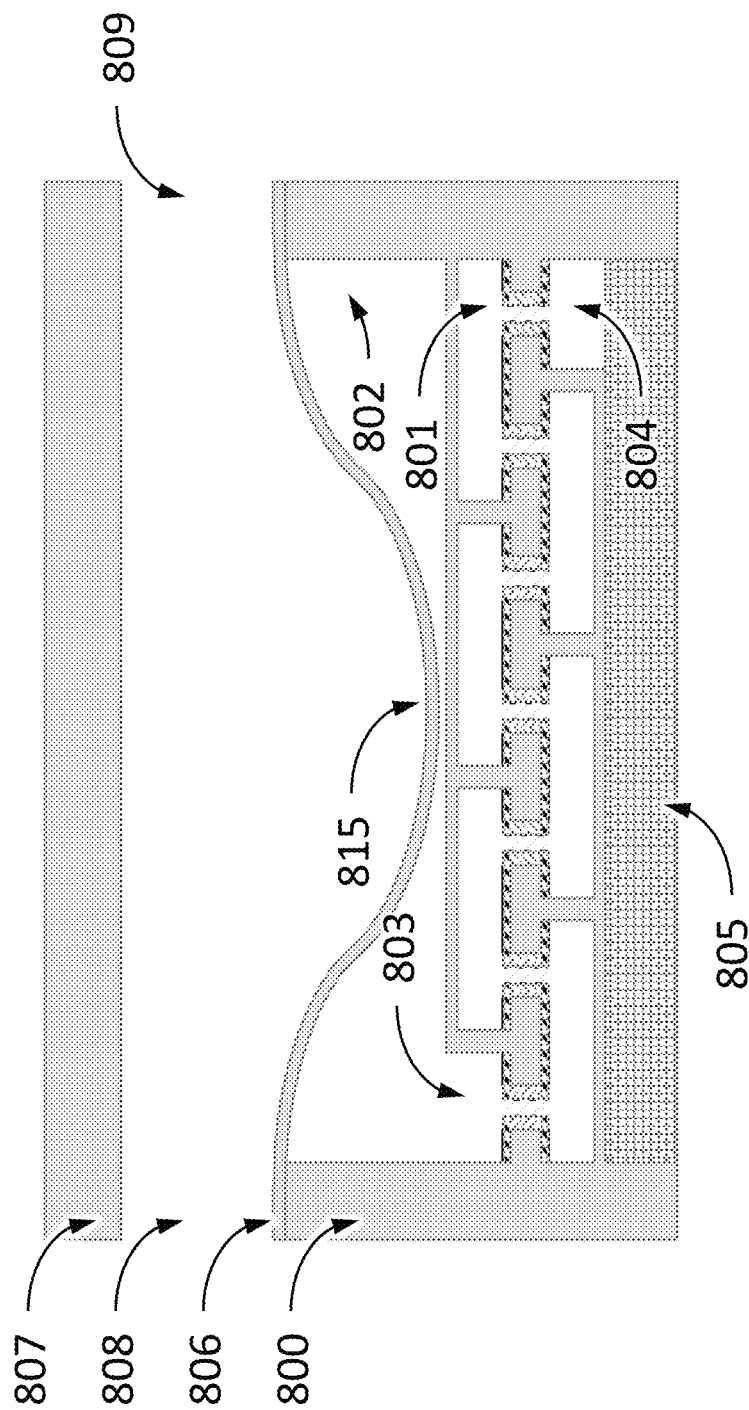
FIG. 8E describes a cross sectional view of an exemplary apparatus first introduced in FIG. 8A, wherein the nano gas pump has partially evacuated the gas in the pneumatic chamber causing the membrane to depress and increase the volume of the secondary chamber.

FIG. 8A shows the cross section (811), FIG. 8B shows the cross section (812) and FIG. 8C shows the cross section (813). The cross sections describe a typically pneumatically driven micro fluidic value colloquially knowns as a "Quake Valve". A fluidic channel (808, 809) is formed in the top substrate (807) and fused to a membrane (806, 810) and a bottom substrate (800). Traditionally compressed or rarified air is introduced into the control cavity (802) to impede or encourage the flow of a secondary fluid in the fluidic channel (808, 809). When operated to pressurize control volume (802) the membrane (810) forms a seal (814) to the top of the fluidic channel (808, 809) as shown in FIG. 8D. When operating to rarify the control volume (802) the membrane (810) pulls fluid into an expanded volume (815) as shown in FIG. 8E.

Figure 9A:
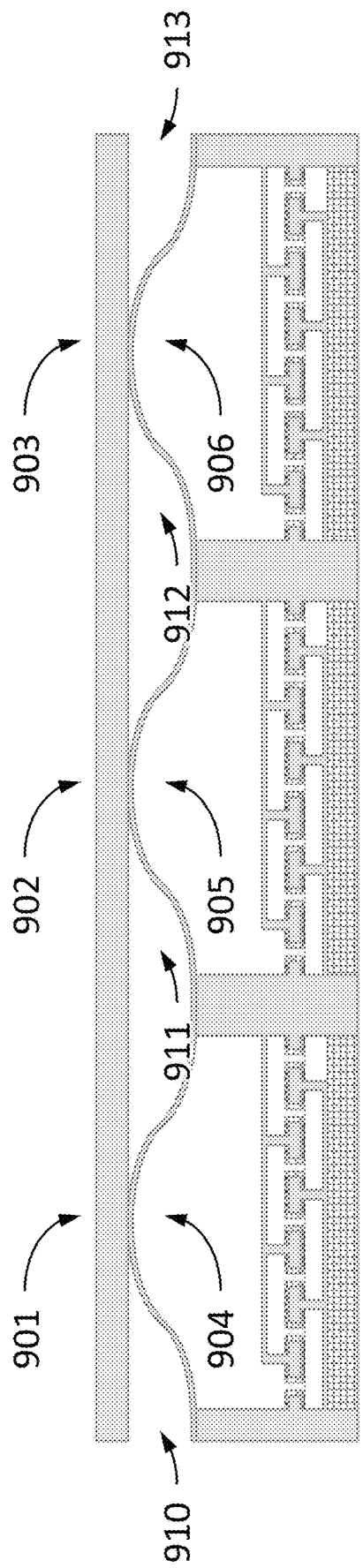
FIG. 9A describes a cross sectional view of three exemplary apparatuses first introduced in FIG. 8A, and connected in series, in an exemplary apparatus to peristaltically move a secondary fluid, configured for a straight flow.

When the exemplary embodiment of an integrated pneumatic valve first shown in FIG. 8A through FIG. 8E are connected as shown in the exemplary embodiment in FIG. 9A, more complex actions can be performed. In FIG. 9A, the first integrated pneumatic valve (901) with a control volume (904) is connected to the second integrated pneumatic valve (902) with a control volume (905) which is connected to the third integrated pneumatic valve (903) with a control volume (906), sharing a single fluidic channel (910-913).

Figure 9B:
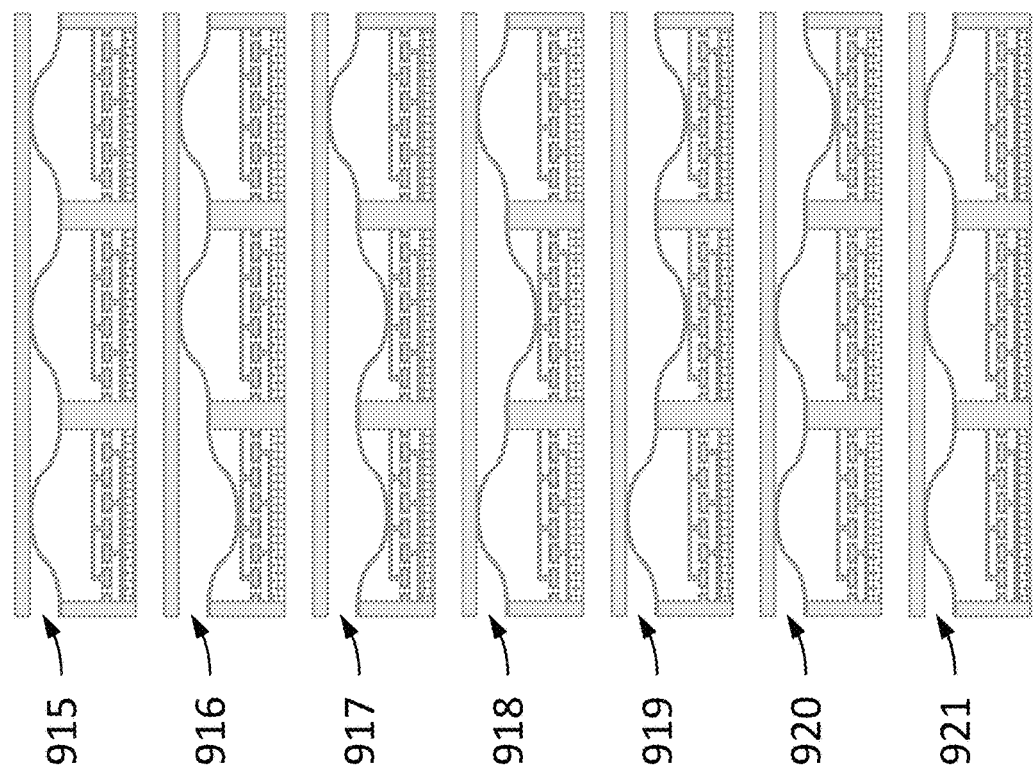
FIG. 9B describes a cross a sequence of action by the exemplary apparatus first introduced in FIG. 9A, wherein a fixed volume of secondary fluid is pumped through the apparatus.

When all three valves are actuated (915), as shown in FIG. 9B, then all flow is stopped. By rarifying the first control volume (904) as shown in (916), fluid is pulled from the inlet (910) into the first valve (901). Next, by rarifying the second control volume (905) as shown in (917), fluid is further pulled from the inlet (910) into the second valve (902), Next by pressurizing the first control volume (904) as shown in (918) and rarifying the third control volume (906) as shown in (919), the fluid is now in communication with the outlet (913). Next by pressurizing the second control volume (905) as shown in (920), the fluid in now pushed out of the second valve (902) and into the outlet (913). Next by pressurizing the third control volume (906) as shown in (921), the fluid is now pushed out of the third valve (903) and into the outlet. Repeating this sequence advances a single known amount of fluid from the inlet of the fluidic channel to the outlet. Reversing the sequences advances a single known amount of fluid from the outlet (913) of the fluidic channel to the inlet (910).

Figure 9C:
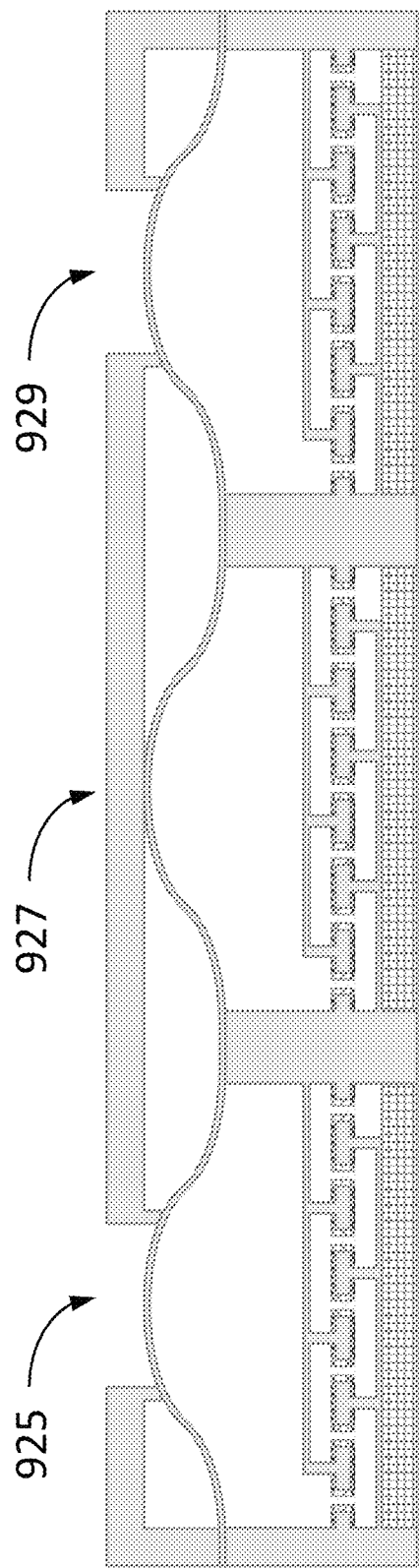
FIG. 9C describes a cross sectional view an exemplary apparatus first introduced in FIG. 9A, wherein the inlet and outlet are configured for a turn flow.
Figure 9D:
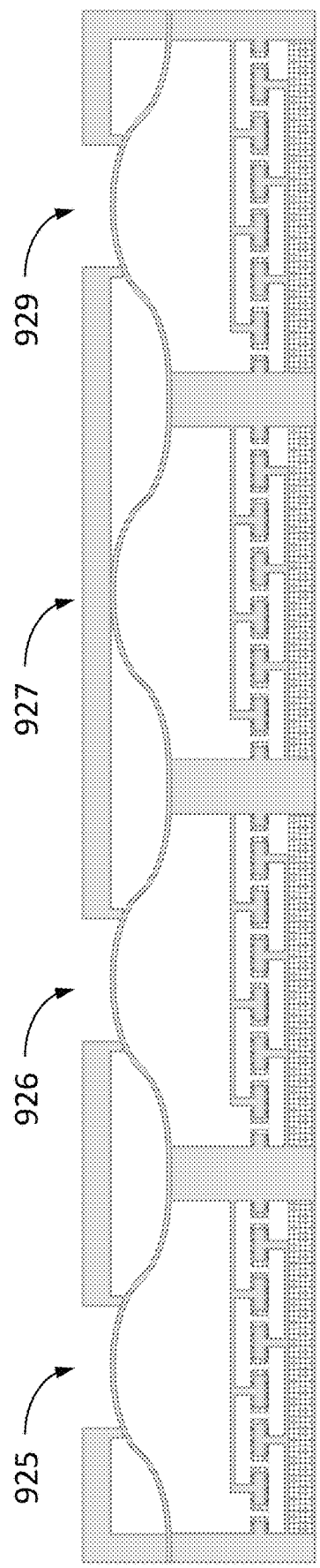
FIG. 9D describes a cross sectional view of an exemplary apparatus introduced in FIG. 9C, further configured for multiple inlets.

The arrangement of the fluidic channel can be further configured as shown in FIG. 9C. Here the inlet (925) is at the top of the first substrate. A main pumping valve (927) is in the middle an outlet valve (929) is at the end. The arrangement in FIG. 9C can be further configured as shown in FIG. 9D where there is a second inlet (926), this may be advantageous when the arrangement for pumping medicine into a patient.

Figure 9E:
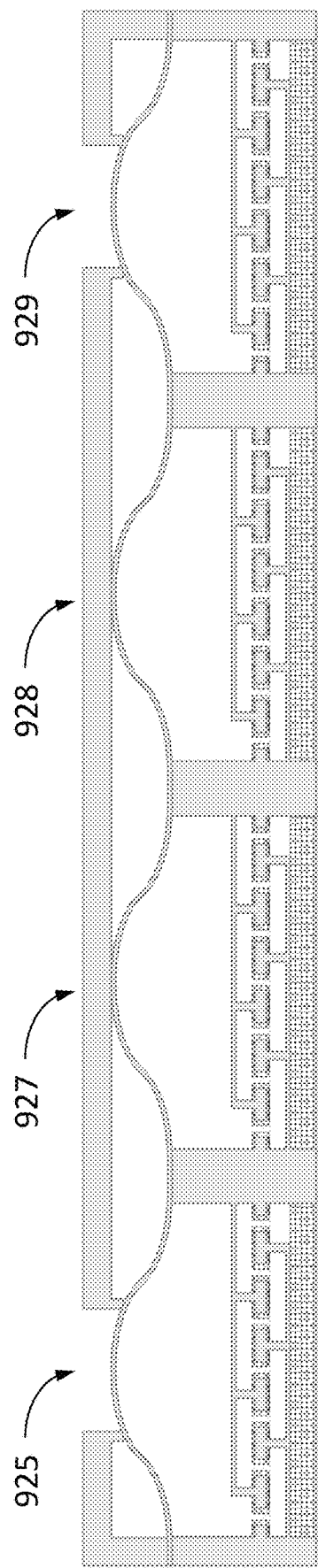
FIG. 9E describes a cross sectional view of an exemplary apparatus introduced in FIG. 9C, further configured with multiple pumping chambers.
Figure 9F:
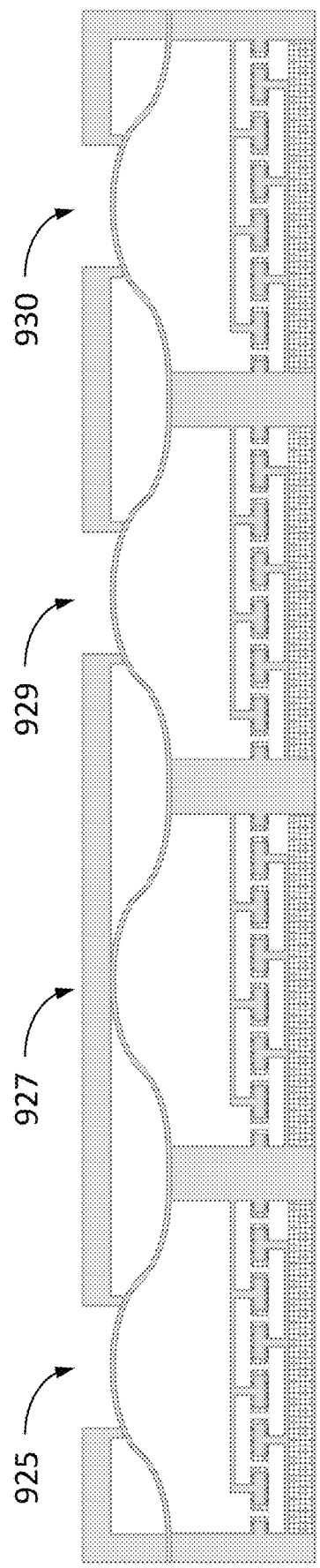
FIG. 9F describes a cross sectional view of an exemplary apparatus introduced in FIG. 9C, further configured with multiple outlets.

The arrangement in FIG. 9C can be further configured as shown in FIG. 9E, where there is a second pumping valve (928), this may be advantageous when the first pumping valve (927) moves a significantly different volume than the second pumping valve (928), or higher pressures are needed to move the fluid. The arrangement in FIG. 9C can be further configured as shown in FIG. 9F where there is a second outlet valve (930), this may be advantageous when distributing fluids in a microfluidic circuit. The arrangement in FIG. 9C can be further configured for any arbitrary number of inlets, pumping valves and outlets.

Fabrication

Figure 10:
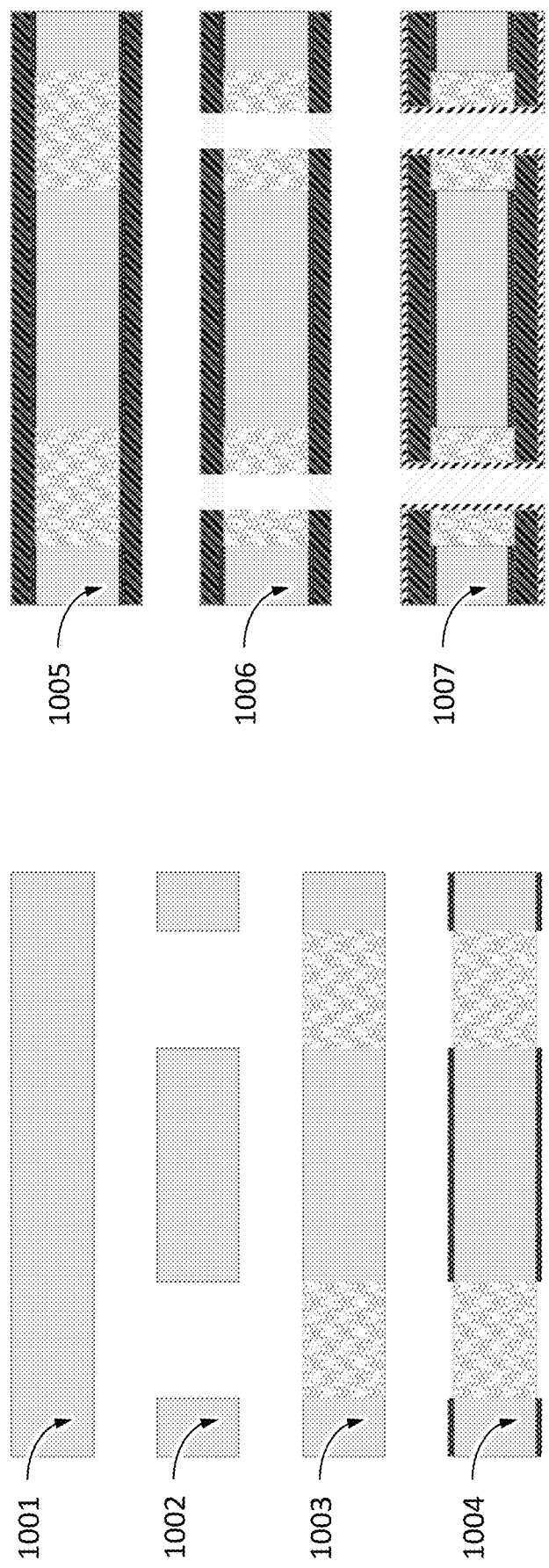
FIG. 10 describes an exemplary fabrication of FIG. 3D.

An exemplary method of fabricating the exemplary apparatus in FIG. 3D is shown in FIG. 10. We may start with a thin substrate with a thickness of 1 um as shown in (1001). A 100 nm layer of silicon nitride may be grown as an etch stop for a subsequent process step. The substrate may be part of a silicon on insulator wafer. Apertures defining the active area are patterned and etched and may be 3 µm in diameter as shown in (1002). Silicon oxide is grown over the substrate and the substrate is planarized and stopped on the silicon nitride layer as shown in (1003). Openings in the handle are patterned and etched to expose the top silicon membrane. 100 nm of tungsten from tungsten hexafluoride is grown in a chemical vapor deposition chamber, and then patterned and etched with diameters of 3 µm as shown in (1004). 250 nm of P-type silicon germanium material with optimal carrier concentration to maximize ZT at room temperature is grown over the substrate in a chemical vapor deposition furnace as shown in (1005), followed by 10 nm of aluminum oxide by atomic layer deposition. 250 nm apertures are pattered and etched through the membrane, as shown in (1006), followed by 25 nm of n-type silicon germanium material with optimal carrier concentration to maximize ZT at room temperature is grown over the substrate in a chemical vapor deposition furnace as shown in (1007). 100 nm access holes may be patterned and etched on the top of the membrane until the buried oxide, and then vapor HF can be used to remove the oxide layer in the separating the top and bottom p-type thermoelectric material. A power supply may then apply 10 mV from the bottom to the top of the membrane. The voltage may be increased until the temperature at the edge of the membrane is 90° C.

Optimal carrier concentration for silicon germanium depends on stoichiometry and is generally around $10^{20}$ per cubic centimeter. While N. M. Ravindra, B. Jariwala, A. Banobre and A. Maske describe "Thermoelectric properties of silicon germanium alloys" in chapter 4 of SpringerBriefs in Materials, and it is a good starting point, each commercial fab working with silicon germanium will have their own recipe for p-type silicon germanium transistors and n-type silicon germanium transistors, and the doping will generally need to increase 2 orders of magnitude per cubic centimeter for thermoelectric applications. Therefore, a proper DOE needs to be executed to find the doping level corresponding to the peak ZT at room temperature.

The Arrangement Apparatus Optimization Methods

The geometry of the invented device can be adjusted and fine-tuned using numerical and or analytical means and is generally the subject of optimization. The optimization may proceed through iterations and can be represented in the following algorithm:

```
Model Evolution Algorithm
Set C #model constraints
Set P #set of search parameters
Set M #initial approximation of the embodiment
Do While performance criteria K are not met
    Do While numerical solution accuracy A is not reached
        Run kinetic gas solver using C
        Run solid thermoelectric and heat conduction solver
            using C
        Integrated gas-solid solution S
    End Do
    Update M using S and P
End Do
```

The optimization should be based on key geometric and flow parameters P, such as the dimensions of the electrical and structural components, thermoelectric materials, gas compression chambers, the angles of the mounts, the distance between sequential stages, the number of stages in series and in parallel, aperture sizes, materials, etc. It may be bound by a set of constraints C such as the preferred operating pressure, gas species, input power, costs of materials and process, etc. The optimization process may also use the end-of-optimization criteria K such as the desired mass flow and compression ratios. As mentioned earlier, the mass flow and pressure gradient oppose each other. The higher the mass flow through the device, the lower the pressure gradients, and vice versa, the higher the pressure gradients, the lower the mass flow. Therefore, to optimize the system design, both the minimally acceptable pressure difference and the mass flow may be required. The optimization should start with an initial approximation of the apparatus model M, which may be the examples of a single stage and multi-stage embodiments shown above. After that, the main loop is run until the optimum configuration M is found that satisfies the criteria K. In that loop, the model M is adjusted using the search parameters P and the output from performance evaluating solution block. The latter one may be represented as a "do" loop that runs until some prescribed numerical accuracy is reached and may include stand-alone or unified solvers for the gas flow inside the apparatus and the heat flow inside the solid blocks of the device. While simple analytical estimates are possible for these solver steps, the best accuracy of numerical solution would be provided by kinetic gas solvers and finite volume of finite element solvers for the heat conduction, electrical and thermoelectric equations that may also include heat transfer mechanisms such as convection and radiation, etc. The computational optimization process may be assisted and amended by experimental means.

An example optimization loop is as follows. Let an application, such as fluid manipulation in microchannels for a lab-on-a-chip device, requires a pump that is less than 1 mm in each of the three dimensions, draws no more than 1 mW of electric power and produces a pressure drop of 20 kilo pascals (kPa). Then one may begin with a pump geometry shown in FIG. 6A and assume that the length is 200 µm. That geometry may be modeled in a commercial Multiphysics solver, such as COMSOL, to determine the range of temperature differences across thermoelectric elements that could be expected for a given voltage. Then a gas dynamics simulation may be performed using a kinetic approach which sets the estimated pressure drop across a single stage as well as provides feedback to COMSOL on expected gas-to-surface heat fluxes. COMSOL result may be corrected with that information, and a final estimate may be made on mass flow, power and pressure drop of a single stage. After that, the properties of a multi-stage geometry can be calculated analytically, or if more precision is needed, it can be rebuilt in COMSOL and gas flow in that geometry may be modeled again. In the end, if a solution exists that satisfies the performance criteria, the designer may have a device geometry and properties that fits into the required specification window.

Apparatus Performance Estimate for a Particular Example

Numerical analysis conducted with the direct simulation Monte Carlo (DSMC) and ellipsoidal statistical Bhatnagar-Gross-Krook (ES-BGK) kinetic methods allowed the inventors to obtain key performance parameters of the disclosed turn-flow and straight-flow designs for specific geometrical and flow parameters, which were 1 µm wide thermoelectric elements with a 50 K temperature difference between the cold and the hot sides, 1 µm wide apertures, 3 µm tall and long gas chambers, and a quasi-two-dimensional configuration. The pressure difference ΔP created by three consecutive stages of such turn-flow and straight-flow embodiments is given in Table 1. As seen in the table, there is generally a relatively weak performance degradation with varying gas pressure, as ΔP is within a factor of 2.5 from its peak as the pressure changes by a factor of 30. The average flow velocity $U_f$ of gas passing through an apparatus at 0.3 atm was 2.7 m/s for the turn-flow, and 3.6 m/s for the straight-flow design.

TABLE 1

| Inlet Pressure, atm | ΔP (%), turn-flow design | ΔP (%), straight-flow design |
|---|---|---|
| 0.03 | 1.74 | 1.88 |
| 0.1 | 4.0 | 3.4 |
| 0.3 | 4.2 | 2.97 |
| 1 | 1.73 | 1.07 |

Multi-stage devices were also tested numerically with up to 25 consecutive stages, and the ΔP and $U_f$ based performance degradation was found to be within the numerical error bars of about 0.5%. The expected mass flow degradation for a 400-stage apparatus is less than 5%. The pressure difference and flow velocities were found to change linearly with temperature gradients between the cold and hot ends of the thermoelectric elements, which were varied from 5 K to 50 K. These estimates allow for the maximum performance evaluation based on the gas dynamics inputs (the complete performance evaluation should also include the solution of heat transfer inside the solids, with the gas-surface heat fluxes obtained from kinetic simulations, such as DSMC and ES-BGK).

Such a performance evaluation, conducted for a 1 mm×1 mm×1 mm device, showed that for an input power of 100 mW, the maximum volumetric flow is about 2 mL per min at a maximum compression ratio of 1.2. For a fixed input electric power, the increase or decrease in the desired compression ratio will be accompanied by the proportional decrease or increase in the volumetric flow. The compression ratio and the mass flow are directly proportional to the input power, and the actual pumping capacity of the device may be primarily limited by the maximum power that can be absorbed by the device volume and dissipated into the environment.

While the present disclosure has been described in terms of preferred embodiments, it is recognized that equivalents, alternatives, and modifications, aside from those expressly stated, are possible and within the scope of the appending claims.

We claim:

1. An apparatus for creating a temperature gradient in a gas comprising:
    a second thermoelectric material that is in communication with the gas for the purpose of imposing a temperature gradient on the gas;
    a first thermoelectric material that is complementary to the second thermoelectric material and in contact with the second thermoelectric material and in contact with a heat sink and a first electrical conductor; and
    a third thermoelectric material that is complementary to the second thermoelectric material and in contact with the second thermoelectric material and in contact with the heat sink and a second electrical conductor that is configured to provide a current from the first thermoelectric material to the third thermoelectric material.

2. The apparatus of claim 1, wherein the dimensions of the thermoelectric materials are optimally matched to the heat pumping requirements of the gas being pumped.

3. The apparatus of claim 1, wherein the first thermoelectric and third thermoelectric materials are p-type and the second thermoelectric material is n-type.

4. The apparatus of claim 1, wherein the first thermoelectric and third thermoelectric materials are n-type and the second thermoelectric material is p-type.

5. The apparatus of claim 1, wherein the first thermoelectric and third thermoelectric materials are of the same type and the second thermoelectric material is replaced with an electrical conductor that is thinner than 25 nm.

6. The apparatus of claim 1, wherein at least one of the first thermoelectric material and third thermoelectric material is an electrical and thermal conductor.

7. The apparatus of claim 1, wherein the first thermoelectric and second thermoelectric materials and/or the second thermoelectric and third thermoelectric materials are connected by a third electrical conductor.

8. The apparatus of claim 1, wherein the contacts among the thermoelectric materials overlap.

9. The apparatus of claim 1, wherein at least one of the first thermoelectric and third thermoelectric materials are a third electrical conductor that is connected to a shared heat sink.

10. The apparatus of claim 1, wherein the heat sink forms the first and second electrical conductors.

11. The apparatus of claim 1, further comprising a coating on at least one of the first, second and third thermoelectric materials.

12. The apparatus of claim 1, where the temperature gradient is sufficient to pump gas in the direction of the temperature gradient using thermal diffusion.

13. The apparatus of claim 1, wherein the second thermoelectric material forms an aperture between two separate volumes of gas.

14. An apparatus comprising a plurality of apparatuses each comprising an apparatus of claim 1 connected fluidically in parallel and/or in series in a predetermined arrangement to yield a desired flow rate or compression ratio.

15. A method of isolating a temperature gradient in a gas, comprising:
    imposing a primary temperature gradient on an adjacent gas with a second thermoelectric material;
    configuring a first thermoelectric material that is complementary to the second thermoelectric material and in contact with the second thermoelectric material and in contact with a heat sink and a first electrical conductor to provide a first current and create a temperature gradient from the heat sink to the second thermoelectric material; and
    configuring a third thermoelectric material that is complementary to the second thermoelectric material and in contact with the second thermoelectric material and in contact with the heat sink and a second electrical conductor to provide a second current and create a temperature gradient from the heat sink to the second thermoelectric material.

16. The method of claim 15, wherein a supplied electric current is bidirectional, thus changing the direction of the temperature gradient.

17. The method of claim 15, wherein the supplied electric current is continuous.

18. The method of claim 15, wherein the supplied electric current is pulsed.

\* \* \* \* \*